(12) United States Patent
Lee et al.

(10) Patent No.: US 10,644,008 B2
(45) Date of Patent: May 5, 2020

(54) SEMICONDUCTOR DEVICE

(71) Applicant: Samsung Electronics Co., Ltd., Suwon-si, Gyeonggi-do (KR)

(72) Inventors: Jun-won Lee, Asan-si (KR); Jae-kang Koh, Seongnam-si (KR); Geum-bi Mun, Suwon-si (KR); Byoung-deog Choi, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 175 days.

(21) Appl. No.: 15/871,957

(22) Filed: Jan. 15, 2018

(65) Prior Publication Data

US 2019/0067294 A1 Feb. 28, 2019

(30) Foreign Application Priority Data

Aug. 31, 2017 (KR) .................. 10-2017-0111046

(51) Int. Cl.
*H01L 27/108* (2006.01)
*H01L 23/522* (2006.01)
*H01L 23/532* (2006.01)
*H01L 21/02* (2006.01)
*H01L 21/768* (2006.01)
(Continued)

(52) U.S. Cl.
CPC .. *H01L 27/10888* (2013.01); *H01L 21/02049* (2013.01); *H01L 21/31116* (2013.01); *H01L 21/7682* (2013.01); *H01L 21/76877* (2013.01); *H01L 23/5226* (2013.01); *H01L 23/5283* (2013.01); *H01L 23/5329* (2013.01); *H01L 27/10814* (2013.01); *H01L 27/10823* (2013.01); *H01L 27/10876* (2013.01); *H01L 27/10885* (2013.01); *G11C 11/407* (2013.01)

(58) Field of Classification Search
CPC ......... H01L 27/10888; H01L 21/02049; H01L 21/7682; H01L 21/76877; H01L 23/5226; H01L 23/5283; H01L 23/5329; H01L 27/10814; H01L 27/10823; H01L 27/10885; G11C 11/407
See application file for complete search history.

(56) References Cited

U.S. PATENT DOCUMENTS 9,006,078 B2 4/2015 Kim
9,437,560 B2 9/2016 Park et al.
(Continued)

FOREIGN PATENT DOCUMENTS

KR 20140124176 A 10/2014
KR 20170003830 A 1/2017

*Primary Examiner* — Fernando L Toledo
*Assistant Examiner* — Neil R Prasad
(74) *Attorney, Agent, or Firm* — Renaissance IP Law Group LLP

(57) ABSTRACT

A first bit line structure is disposed between a first contact structure and a second contact structure. A first air spacer is interposed between the first contact structure and the first bit line structure. A first separation space is connected to an air entrance of the first air spacer and interposed between the first contact structure and the first bit line structure. A cover insulating pattern with a gap portion is interposed between the first contact structure and the second contact structure. The gap portion has a downwardly-decreasing width. An air capping pattern covers the cover insulating pattern to seal the first separation space.

20 Claims, 22 Drawing Sheets

(51) Int. Cl.
*H01L 23/528* (2006.01)
*H01L 21/311* (2006.01)
*G11C 11/407* (2006.01)

(56) References Cited

U.S. PATENT DOCUMENTS

| | | |
|---|---|---|
| 9,496,223 B2 | 11/2016 | Lee et al. |
| 9,515,022 B2 | 12/2016 | Kwon et al. |
| 9,576,902 B2 | 2/2017 | Park et al. |
| 9,589,898 B2 | 3/2017 | Chun |
| 9,620,451 B2 | 4/2017 | Hwang et al. |
| 2014/0159194 A1* | 6/2014 | Song ............... H01L 29/0649 257/522 |
| 2015/0035050 A1* | 2/2015 | Yeom ............... H01L 23/48 257/330 |
| 2016/0027727 A1* | 1/2016 | Kim ............... H01L 21/764 257/774 |
| 2016/0049409 A1 | 2/2016 | Yeom et al. |
| 2016/0086955 A1 | 3/2016 | Wu |
| 2016/0211215 A1 | 7/2016 | Lee et al. |
| 2016/0247711 A1 | 8/2016 | Kim |
| 2016/0247760 A1 | 8/2016 | Lee et al. |
| 2016/0267949 A1 | 9/2016 | Han et al. |
| 2016/0300795 A1 | 10/2016 | Kim et al. |
| 2016/0329337 A1 | 11/2016 | Hwang et al. |
| 2017/0005097 A1 | 1/2017 | Kim et al. |
| 2017/0005166 A1 | 1/2017 | Park et al. |
| 2017/0062347 A1 | 3/2017 | Kim et al. |
| 2017/0154805 A1 | 6/2017 | Kim et al. |

\* cited by examiner

A - A'          C - C'

A - A'

A - A'

A - A'

A - A'

A - A'

A – A'

A - A'

A - A'

A – A'

US 10,644,008 B2

SEMICONDUCTOR DEVICE

CROSS-REFERENCE TO RELATED APPLICATION

This application claims priority under 35 U.S.C. § 119 to Korean Patent Application No. 10-2017-0111046, filed on Aug. 31, 2017, in the Korean Intellectual Property Office, the disclosure of which is incorporated by reference herein in its entirety.

TECHNICAL FIELD

The present inventive concept relates to a semiconductor device and a method of fabricating thereof.

DISCUSSION OF RELATED ART

With the development of electronics and users' demand, electronic devices have become smaller and lighter. Accordingly, semiconductor devices having a high degree of integration are required for use in electronic devices, and thus, the design rule for elements of a semiconductor device is decreasing.

SUMMARY

According to an exemplary embodiment of the present inventive concept, a semiconductor device is provided as follows. A first bit line structure is disposed between a first contact structure and a second contact structure. A first air spacer is interposed between the first contact structure and the first bit line structure. A first separation space is connected to an air entrance of the first air spacer and interposed between the first contact structure and the first bit line structure. A cover insulating pattern with a gap portion is interposed between the first contact structure and the second contact structure. The gap portion has a downwardly-decreasing width. An air capping pattern covers the cover insulating pattern to seal the first separation space.

According to an exemplary embodiment of the present inventive concept, a semiconductor device is provided as follows. A first bit line structure is disposed between a first contact structure and a second contact structure. A first air spacer is interposed between the first contact structure and the first bit line structure. A plug structure is interposed between the first contact structure and the second contact structure. A first separation space is disposed between the first air spacer and the plug structure and connected to the first air spacer. The first separation space has a width increasing in a direction from the first air spacer to the plug structure.

According to an exemplary embodiment of the present inventive concept, a semiconductor device is provided as follows. A first bit line structure is disposed between a lower portion of the first contact structure and a lower portion of the second contact structure. An upper portion of the second contact structure is on an upper surface of the first bit line structure. A first air spacer is interposed between the lower portion of the first contact structure and a lower portion of the first bit line structure. A first separation space is connected to an air entrance of the first air spacer and interposed between an upper portion of the first contact structure and an upper portion of the first bit line structure. A plug structure is interposed between the upper portion of the first contact structure and the upper portion of the second contact structure to seal the first separation space.

According to an exemplary embodiment of the present inventive concept, a method of fabricating a semiconductor device is provided as follows.

A bit line structure is formed on a substrate. A first contact structure and a second contact structure are formed on the substrate. The bit line structure is disposed between the first contact structure and the second contact structure. The second contact structure is on an upper surface of the bit line structure. A preliminary insulating spacer structure having a sacrificial spacer is formed to cover a sidewall of the bit line structure. A cover insulating pattern with a gap portion is formed between the first contact structure and the second contact structure. An air spacer is formed by removing the sacrificial spacer through the gap portion. An air capping pattern is formed between the first contact structure and the second contact structure to seal the gap portion of the cover insulating pattern.

BRIEF DESCRIPTION OF THE DRAWINGS

These and other features of the present inventive concept will become more apparent by describing in detail exemplary embodiments thereof with reference to the accompanying drawings of which:

FIGS. 2-8, 9A, 9B, 10, 11A, and 11B are cross-sectional views sequentially showing a method of manufacturing a semiconductor device, according to an exemplary embodiment of the present inventive concept, in which FIGS. 9B and 11B are enlarged cross-sectional views of portion IXb of FIG. 9A and portion XIb of FIG. 11A, respectively;

FIGS. 12A and 12B are respectively a cross-sectional view and an enlarged view thereof showing a main portion of a semiconductor device according to an exemplary embodiment of the inventive concept, in which FIG. 12B is an enlarged cross-sectional view of portion XIIb of FIG. 12A;

FIGS. 13A and 13B are respectively a cross-sectional view and an enlarged view thereof showing a main portion of a semiconductor device according to an exemplary embodiment of the present inventive concept, in which FIG. 13B is an enlarged cross-sectional view of portion XIIIb of FIG. 13A;

FIGS. 14A and 14B are respectively a cross-sectional view and an enlarged view thereof showing a main portion of a semiconductor device according to an exemplary embodiment of the present inventive concept, in which FIG. 14B is an enlarged cross-sectional view of portion XIVb of FIG. 14A;

DETAILED DESCRIPTION OF THE EXEMPLARY EMBODIMENTS

Figure 1:
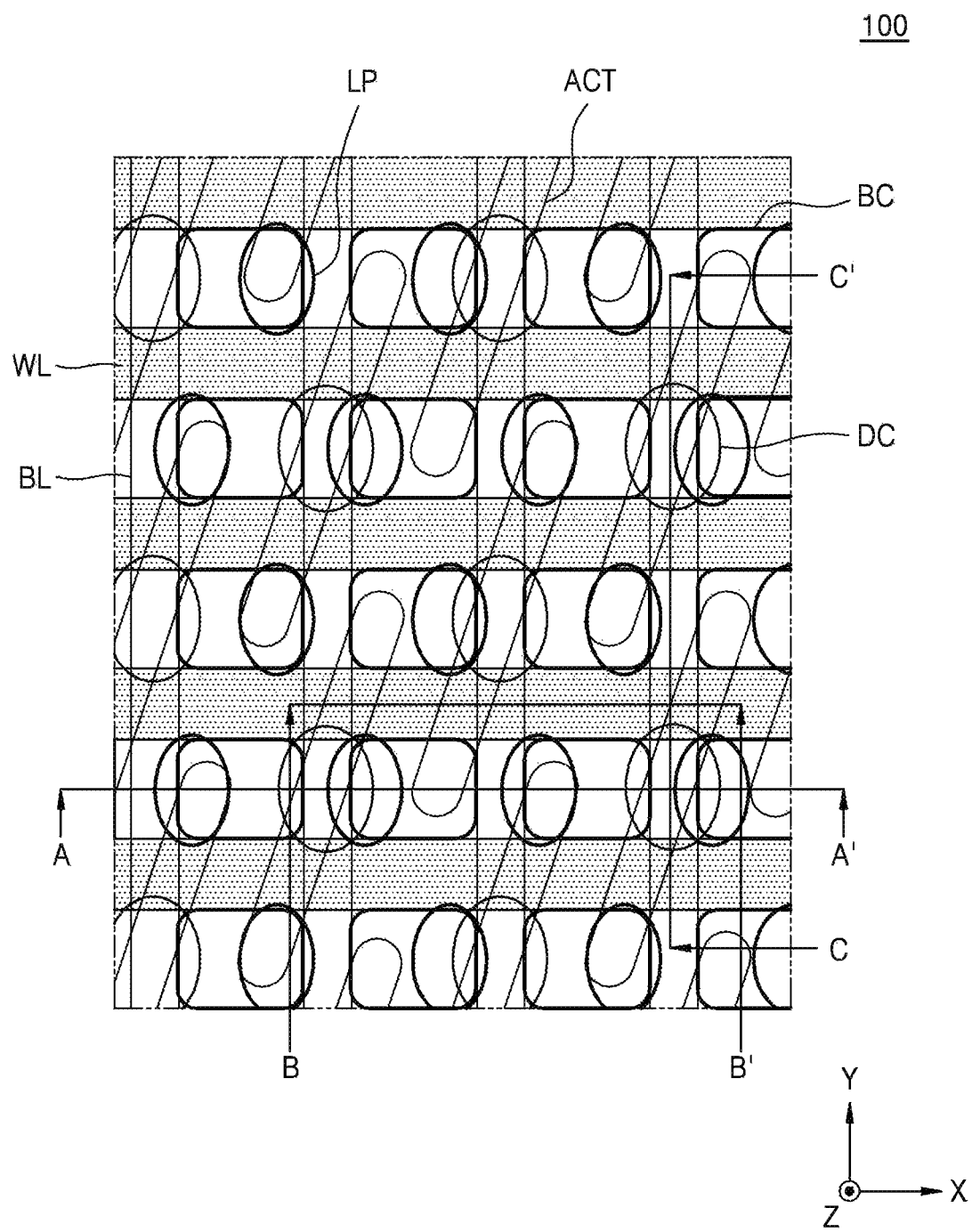
FIG. 1 is a schematic plan layout for describing main elements of a cell array region of a semiconductor device according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. Like reference numerals may refer to the like elements throughout the specification and drawings.

FIG. 1 is a schematic plan layout for describing main elements of a cell array region of a semiconductor device 100 according to an exemplary embodiment of the present inventive concept.

Referring to FIG. 1, the semiconductor device 100 may include a plurality of active regions ACT. In some embodiments, the plurality of active regions ACT may have a major axis in a diagonal axis with respect to a first direction (direction X) and a second direction (direction Y).

Across the plurality of active regions ACT, a plurality of word lines WL may extend in parallel in the first direction (direction X). On the plurality of word lines WL, a plurality of bit lines BL may extend in parallel in the second direction (direction Y) crossing the first direction (direction X).

A plurality of direct contacts DC may be disposed on the plurality of active regions ACT. For example, each of the plurality of direct contacts DC may be disposed on a portion of each of the plurality of active regions ACT. The portion of each of the plurality of active regions ACT may be disposed between two adjacent word lines of the plurality of word lines WL. Each of the plurality of bit lines BL may be electrically connected to one of the plurality of active regions ACT via one of the plurality of direct contacts DC.

In some embodiments, a plurality of buried contacts BC may be formed between two adjacent bit lines of the plurality of bit lines BL. In some embodiments, the plurality of buried contacts BC may be arranged in a row in the first direction (direction X) and the second direction (direction Y), but the present inventive concept is not limited thereto. Although FIG. 1 shows partial overlap between one of the buried contacts BC and one of the direct contacts DC in the plan layout, the buried contacts BC and the direct contacts DC may be vertically spaced apart from each other.

A plurality of landing pads LP may be formed on the plurality of buried contacts BC. Each of the plurality of landing pads LP may extend onto any one of two adjacent bit lines of the plurality of bit lines BL. The plurality of buried contacts BC and the plurality of landing pads LP may connect a plurality of capacitor lower electrodes (not shown) formed on the plurality of bit lines BL to the plurality of active regions ACT. Each of the plurality of landing pads LP may partially overlap one of the plurality of buried contacts BC.

A plurality of capacitors may be formed on the plurality of landing pads LP. Each of the plurality of capacitors may include one of the plurality of capacitor lower electrodes (storage nodes), a capacitor dielectric layer (not shown) covering the one of the plurality of capacitor lower electrodes, and a capacitor upper electrode (not shown) covering the capacitor dielectric layer may be formed on the plurality of landing pads LP.

Figure 2:
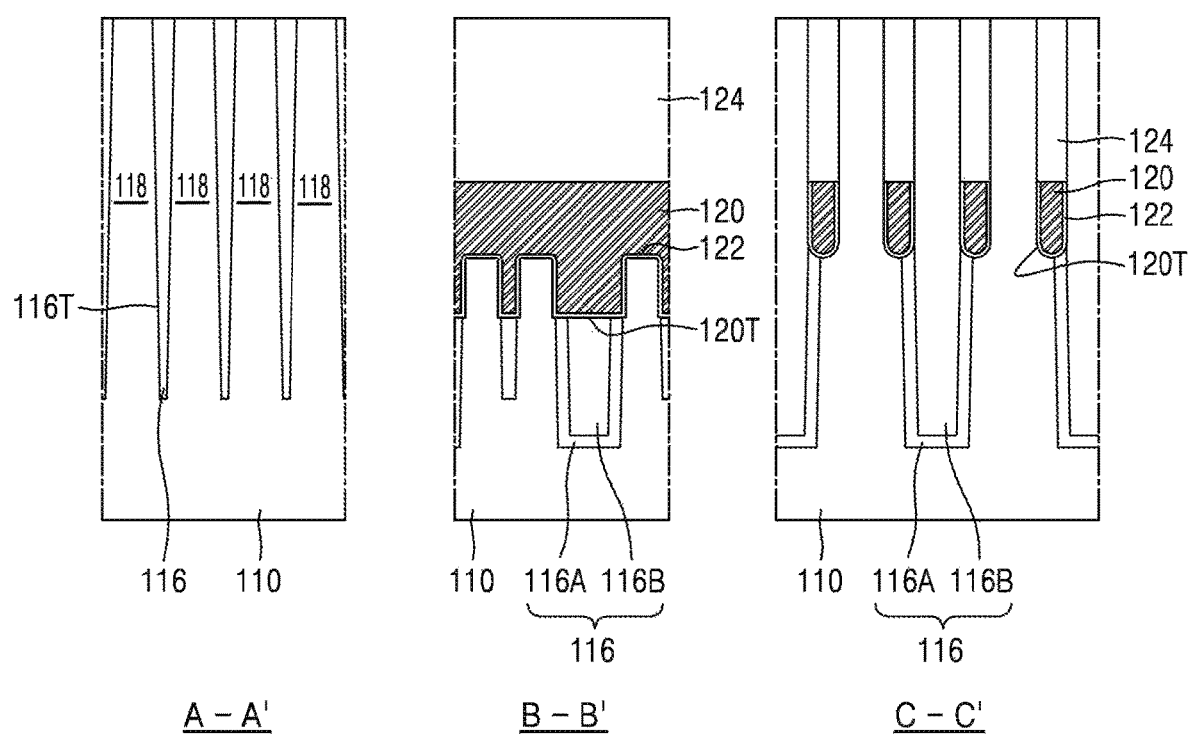
Figure 3:
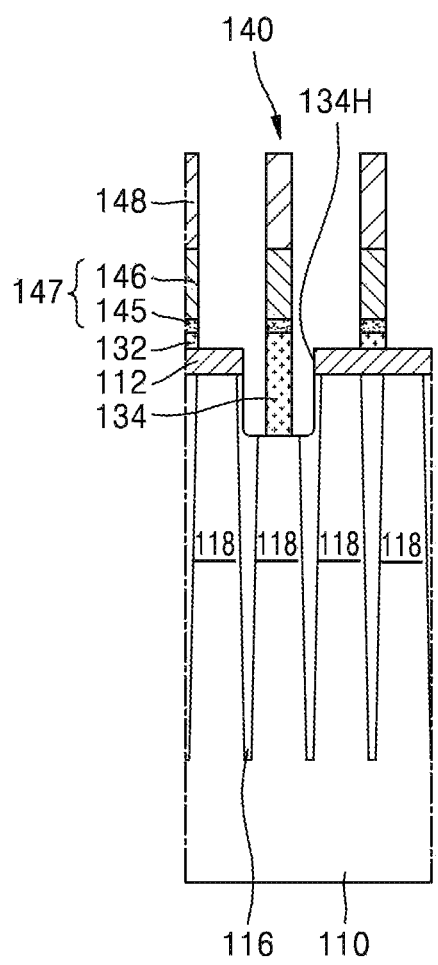
Figure 3:
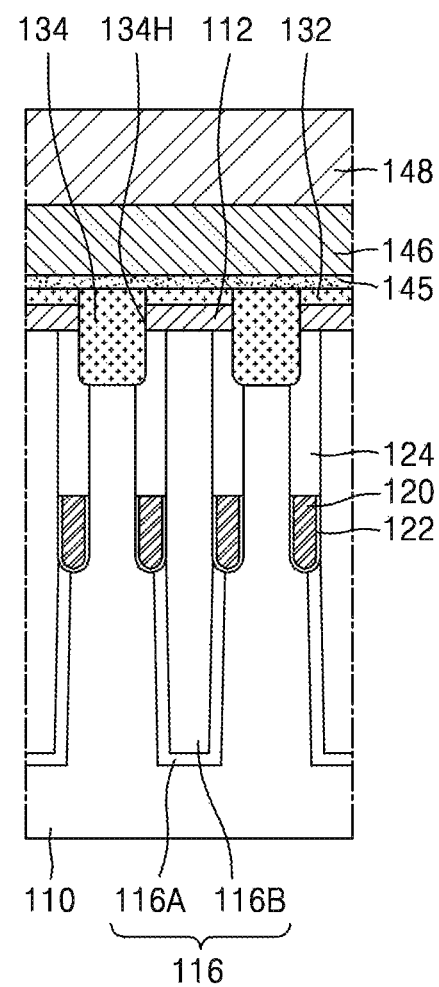
Figure 7:
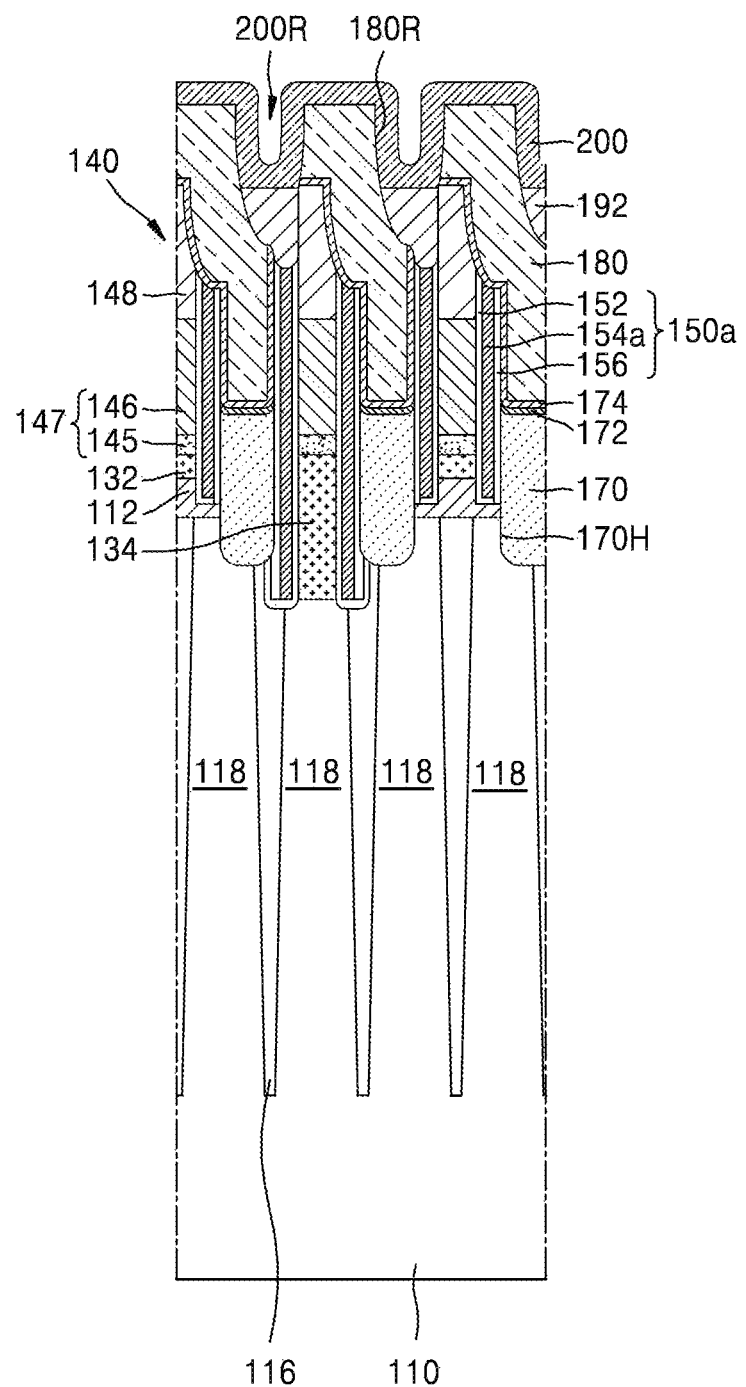
Figure 8:
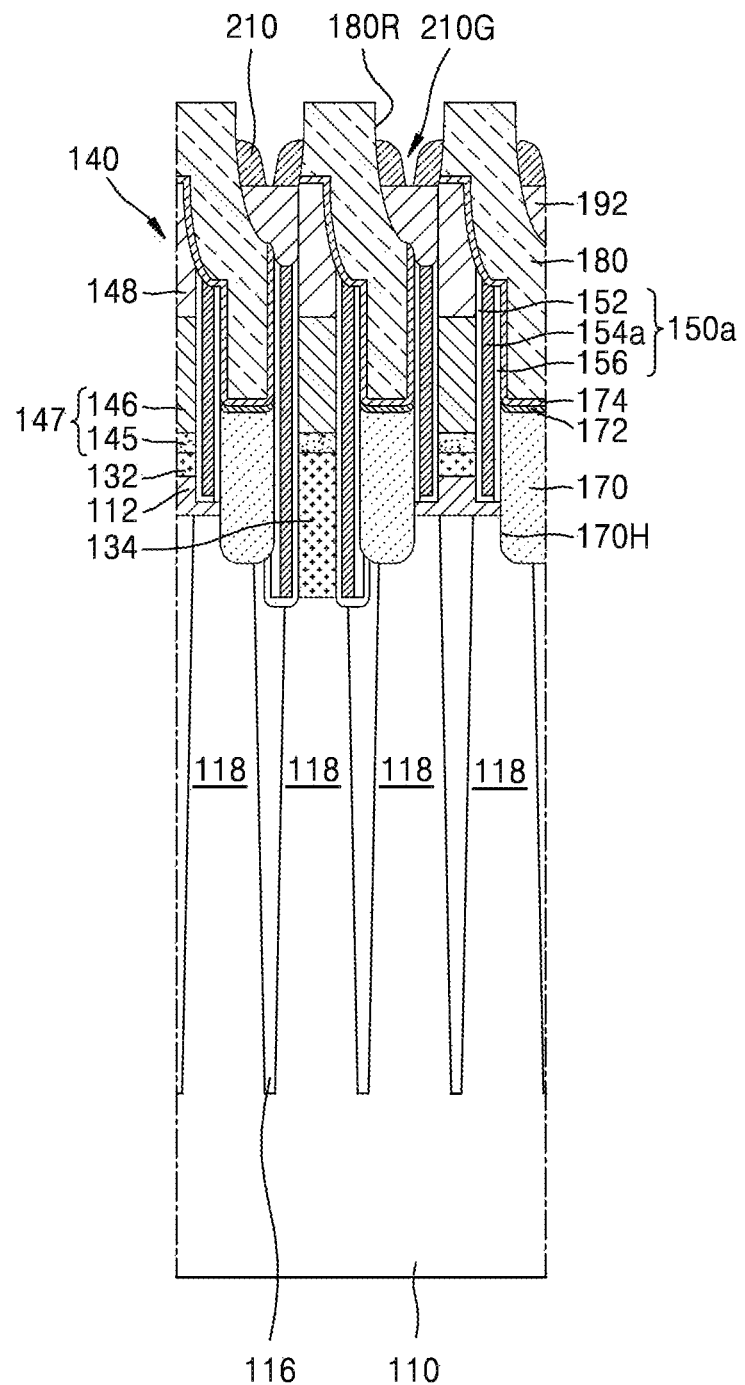
Figure 9A:
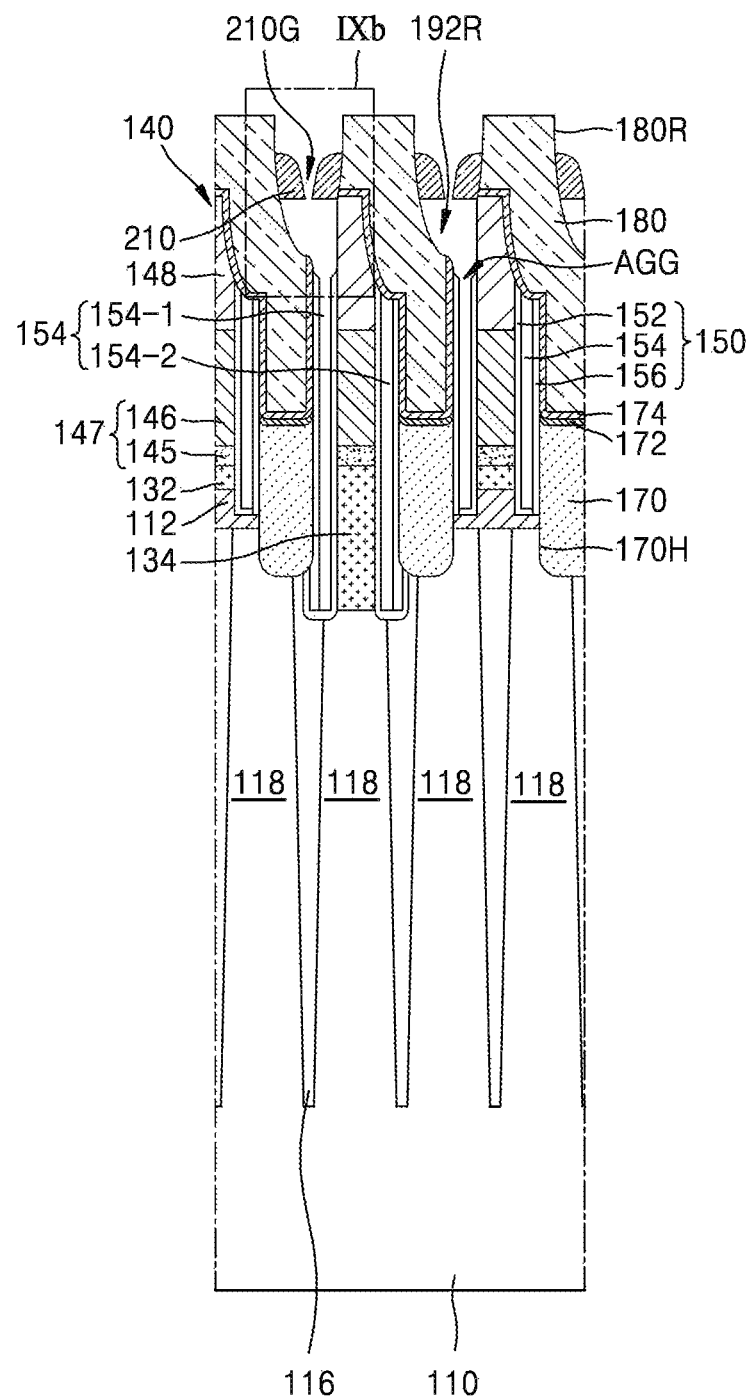
Figure 9B:
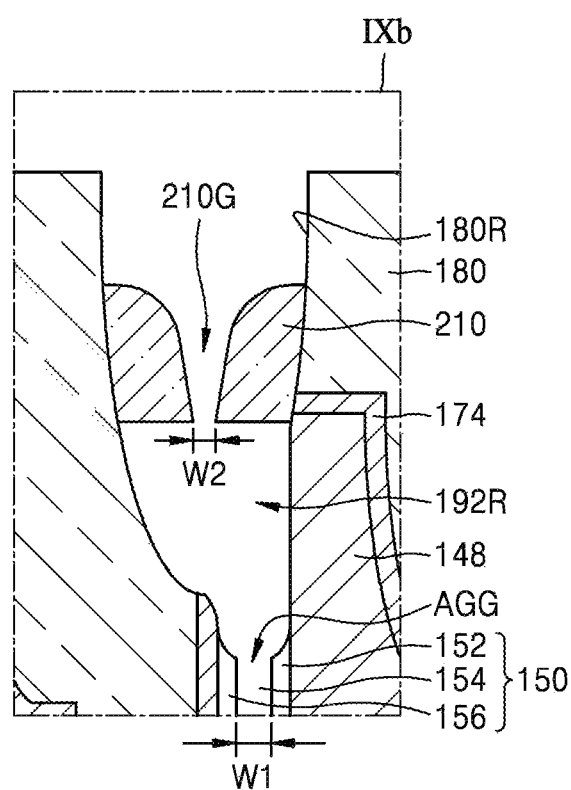
Figure 10:
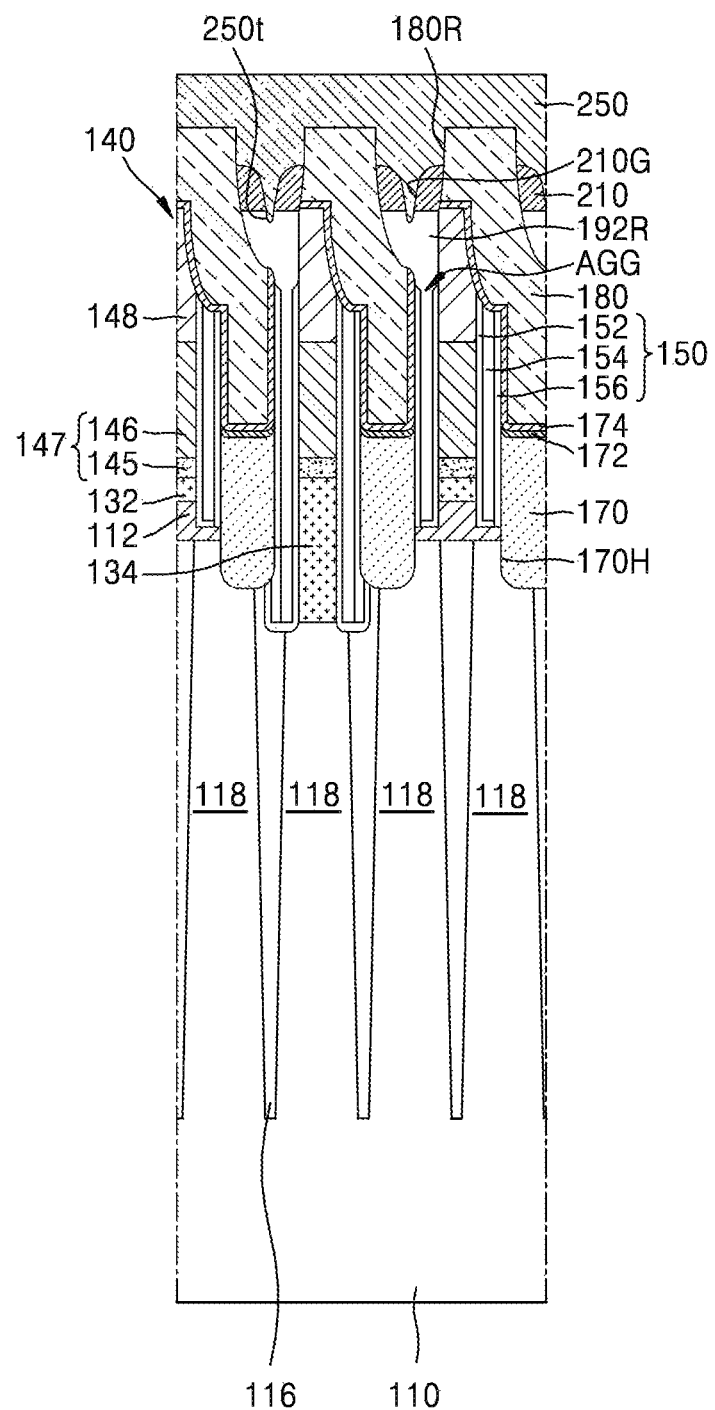
Figure 11A:
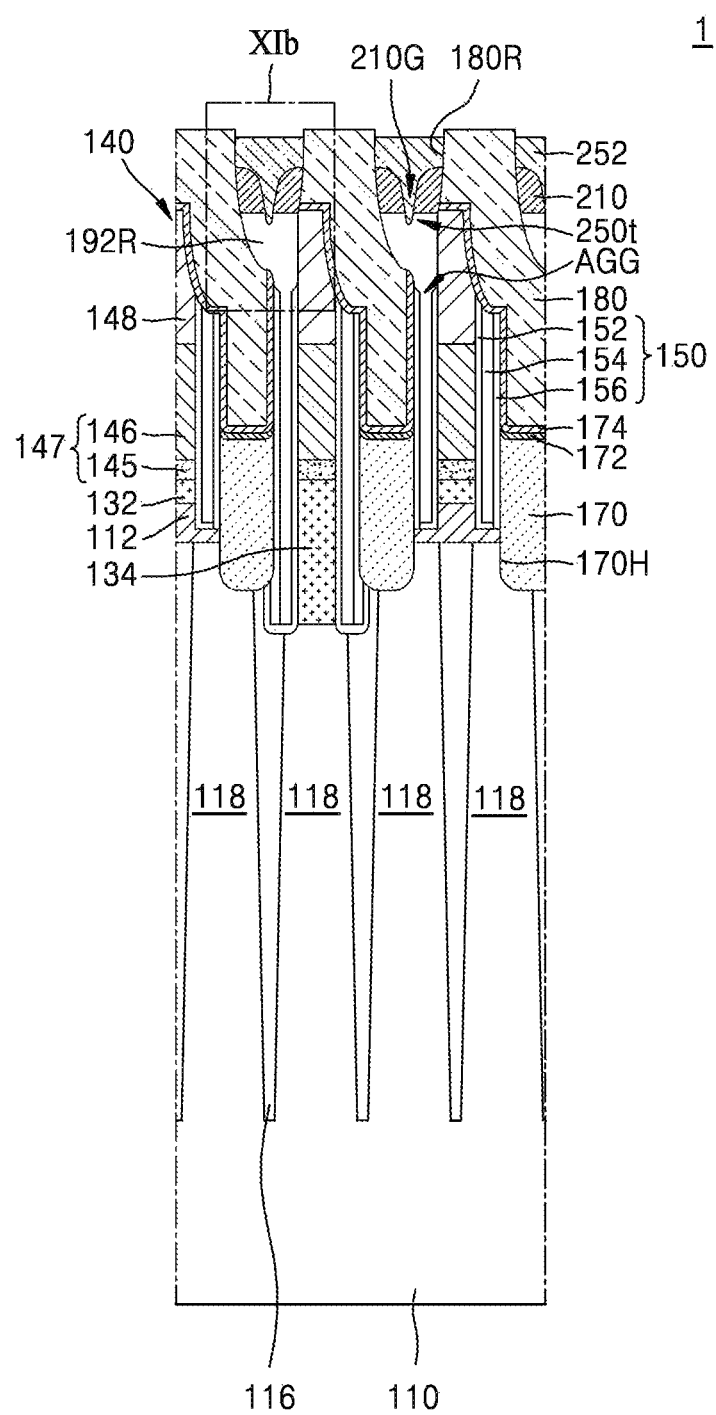
Figure 11B:
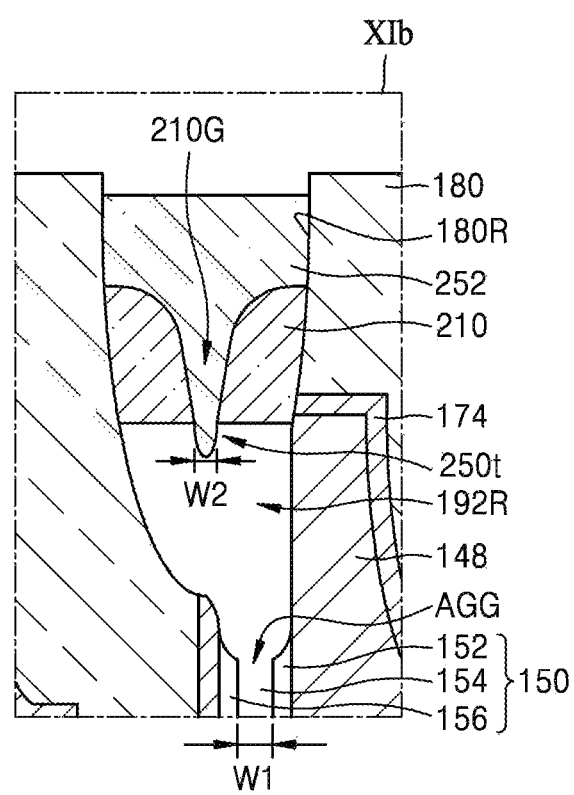

FIGS. 2 to 11B are cross-sectional views sequentially showing a method of manufacturing a semiconductor device, according to an exemplary embodiment of the present inventive concept, in which FIGS. 9B and 11B are enlarged cross-sectional views of portion IXb of FIG. 9A and portion XIb of FIG. 11A, respectively. In detail, FIG. 2 shows cross-sectional views of some processes, taken along portions corresponding to lines A-A', B-B', and C-C' of FIG. 1, FIG. 3 shows cross-sectional views of some processes, taken along portions corresponding to lines A-A' and C-C' of FIG. 1, and FIGS. 4 to 9A, 10, and 11A are cross-sectional views of some processes, taken along a portion corresponding to line A-A' of FIG. 1.

Referring to FIG. 2, a plurality of device separating trenches 116T may be formed in a substrate 110. A plurality of device separating layers 116 may be formed to fill the device separating trenches 116T. A plurality of active regions 118 may be defined on the substrate 110 by the device separating layers 116. The active regions 118 each may have a relatively long island shape with a minor axis and a major axis, as the active regions ACT illustrated in FIG. 1.

The substrate 110 may include, for example, crystalline Si, polycrystalline Si, or amorphous Si. Alternatively, the substrate 110 may include a semiconductor element such as germanium (Ge) and a compound semiconductor including silicon germanium (SiGe), silicon carbide (SiC), gallium arsenide (GaAs), indium arsenide (InAs), or indium phosphide (InP). Alternatively, the substrate 110 may have a silicon-on-insulator (SOI) structure. For example, the substrate 110 may include a buried oxide (BOX) layer. The substrate 110 may include a conductive region, for example, a well doped with impurities or a structure doped with impurities.

The device separating layers 116 may include, for example, a material including a silicon oxide layer, a silicon nitride layer, or a silicon oxynitride layer. The device separating layer 116 may include a single layer including one type of insulating layer, a double layer including two types of insulating layers, or a multi-layer including a combination of at least three types of insulating layers.

In some embodiments, each of the device separating layers 116 may include a first device separating layer 116A and a second device separating layer 116B. The first device separating layer 116A and the second device separating layer 116B may include different materials from each other. For example, the first device separating layer 116A may include an oxide layer, and the second device separating layer 116B may include a nitride layer. However, the present inventive concept regarding the structure of the device separating layer 116 is not limited thereto.

A plurality of word line trenches 120T may be formed in the substrate 110. The plurality of word line trenches 120T may extend in parallel in the first direction (direction X of FIG. 1), and each of the plurality of word line trenches 120T may have a line shape crossing the active region 118. As illustrated in the cross-sectional portion taken along line B-B', in order to form the plurality of word line trenches 120T having a step at the bottom, the device separating layer 116 and the substrate 110 may be respectively etched by separate etching processes so that etching depths of the device separating layer 116 and the substrate 110 may be different from each other.

After the plurality of word line trenches 120T that are formed are cleansed, a gate dielectric layer 122, a plurality of word lines 120, and a plurality of buried insulating layers 124 may be sequentially formed in the plurality of word line trenches 120T. The plurality of word lines 120 may constitute the plurality of word lines WL illustrated in FIG. 1.

In some embodiments, the plurality of word lines 120 may include Ti, TiN, Ta, TaN, W, WN, TiSiN, WSiN, or a combination thereof.

The gate dielectric layer 122 may include a silicon oxide layer, a silicon nitride layer, a silicon oxynitride layer, an oxide/nitride/oxide (ONO) layer, or a high-k dielectric film having a dielectric constant higher than that of a silicon oxide layer. For example, the gate dielectric layer 122 may have a dielectric constant of about 10 to about 25. In some embodiments, the gate dielectric layer 122 may include HfO, HfSiO, HfON, HfSiON, LaO, LaAlO, ZrO, ZrSiO, ZrON, ZrSiON, TaO, TiO, BaSrTiO, BaTiO, SrTiO, YO, AlO, or PbScTaO. For example, the gate dielectric layer 122 may include $HfO_2$, $Al_2O_3$, $HfAlO_3$, $Ta_2O_3$, or $TiO_2$.

An upper surface of the plurality of buried insulating layers 124 may be located at a level substantially the same as a level of an upper surface of the substrate 110. The buried insulating layer 124 may include a silicon oxide layer, a silicon nitride layer, a silicon oxynitride layer, or a combination thereof.

An upper surface of each of the plurality of word lines 120 may be located at a level lower than the level of the upper surface of the substrate 110. The bottom of each of the plurality of word lines 120 may have a convex-concave shape, and a saddle FinFET may be formed in a plurality of active regions 118.

The term 'level' used herein refers to a height in a third direction (direction Z of FIG. 1) perpendicular to a main surface of the substrate 110. For example, being located at the same level or a constant level refers to a location having the same or constant height in the third direction (direction Z of FIG. 1), and being located at a lower/higher level refers to a location having a lower/higher height in the third direction (direction Z of FIG. 1).

In some embodiments, after the plurality of word lines 120 are formed, impurity ions may be implanted into portions of each of the plurality of active regions 118 of the substrate 110 at two sides of each of the plurality of word lines 120 to form a source region and a drain region in the plurality of active regions 118. In some embodiments, the implantation of impurity ions for forming the source region and the drain region may be performed before the plurality of word lines 120 are formed.

Referring to FIG. 3, an insulating layer pattern 112 may be formed on the substrate 110. In some embodiments, the insulating layer pattern 112 may include a nonmetallic dielectric layer. For example, the insulating layer pattern 112 may include a silicon oxide layer, a silicon nitride layer, a silicon oxynitride layer, or a combination thereof.

In some embodiments, the insulating layer pattern 112 may include a plurality of insulating layers stacked on each other. For example, at least one of a plurality of insulating layers constituting the insulating layer pattern 112 may include a metallic dielectric layer. The metallic dielectric layer may include, for example, HfO, HfSiO, HfON, HfSiON, LaO, LaAlO, ZrO, ZrSiO, ZrON, ZrSiON, TaO, TiO, BaSrTiO, BaTiO, SrTiO, YO, AlO, or PbScTaO.

A semiconductor-based conductive layer for forming a conductive semiconductor pattern 132 may be formed on the insulating layer pattern 112. For example, the semiconductor-based conductive layer may include doped polysilicon. In some embodiments, when the insulating layer pattern 112 includes a plurality of insulating layers including a metallic dielectric layer, the semiconductor-based conductive layer need not be formed and may be omitted.

Next, a direct contact hole 134H may penetrate the insulating layer pattern 112 and the semiconductor-based conductive layer. A direct contact conductive layer may fill the direct contact hole 134H and cover the semiconductor-based conductive layer. The direct contact conductive layer may be patterned to a direct contact conductive pattern 134 through a subsequent process.

The direct contact hole 134H may be formed to expose a source region in one of the active regions 118. In some embodiments, the direct contact hole 134H may extend into the one of the active regions 118, for example, into the source region.

The direct contact conductive layer may include, for example, silicon (Si), germanium (Ge), tungsten (W), tungsten nitride (WN), cobalt (Co), nickel (Ni), aluminum (Al), molybdenum (Mo), ruthenium (Ru), titanium (Ti), titanium nitride (TiN), tantalum (Ta), tantalum nitride (TaN), copper (Cu), or a combination thereof. In some embodiments, the direct contact conductive layer may include an epitaxial silicon layer. In some embodiments, the direct contact conductive layer may include doped polysilicon.

In some embodiments, the direct contact hole 134H may be formed before the semiconductor-based conductive layer is formed, and then, the semiconductor-based conductive layer and the direct contact conductive layer may be formed simultaneously. In this case, the semiconductor-based conductive layer and the direct contact conductive layer may include the same materials integrally formed with each other.

Next, a metallic conductive layer and an insulating capping layer for forming a plurality of bit line structures 140 are sequentially formed to cover the insulating layer pattern 112 and the direct contact conductive layer.

In some embodiments, the metallic conductive layer may have a stack structure of a first metallic conductive layer and a second metallic conductive layer. The metallic conductive layer may have a conductive layer stack structure including a double layer. The inventive concept, however, is not limited thereto. For example, the metallic conductive layer may include a single-layer or a multi-layered stack structure of three or more layers.

In some embodiments, the first metallic conductive layer may include titanium nitride (TiN) or TSN (Ti—Si—N), and the second metallic conductive layer may include tungsten (W), or a combination of tungsten and tungsten silicide ($WSi_x$, for example). In some embodiments, the first metallic conductive layer may serve as a diffusion barrier. In some embodiments, the insulating capping layer may include a silicon nitride layer.

By etching the insulating capping layer, the first metallic conductive layer and the second metallic conductive layer, a plurality of bit lines 147 including a first metallic conductive pattern 145 and a second metallic conductive pattern 146 having line shapes, and a plurality of insulating capping lines 148 may be formed. One of bit lines 147 and one of insulating capping lines 148 covering the one of the bit lines 147 may constitute one of the bit line structures 140.

Each of the plurality of bit line structures 140 including one of the bit lines 147 and one of the insulating capping lines 148 may extend in parallel in the second direction (direction Y of FIG. 1) parallel to the main surface of the substrate 110. The bit lines 147 may constitute the bit lines BL illustrated in FIG. 1.

During an etching process for forming the bit lines 147, the direct contact conductive pattern 134 may be formed by also removing a portion of the direct contact conductive layer vertically not overlapping the bit line 147 through etching. In this regard, the insulating layer pattern 112 may serve as an etch stop layer.

During a process of forming the direct contact conductive pattern 134 by etching the direct contact conductive layer, the semiconductor-based conductive layer may also be etched to form the conductive semiconductor pattern 132. The conductive semiconductor pattern 132 may be disposed under one of the bit lines 147, extending in the second direction (direction Y of FIG. 1) as the one of the bit lines 147 does. Since the conductive semiconductor pattern 132 and the one of the bit lines 147 may overlap each other substantially in the third direction (direction Z of FIG. 1), the one of the bit lines 147 and the one of the insulating capping lines 148 may be regarded as constituting one of the bit line structures 140.

Figure 4:
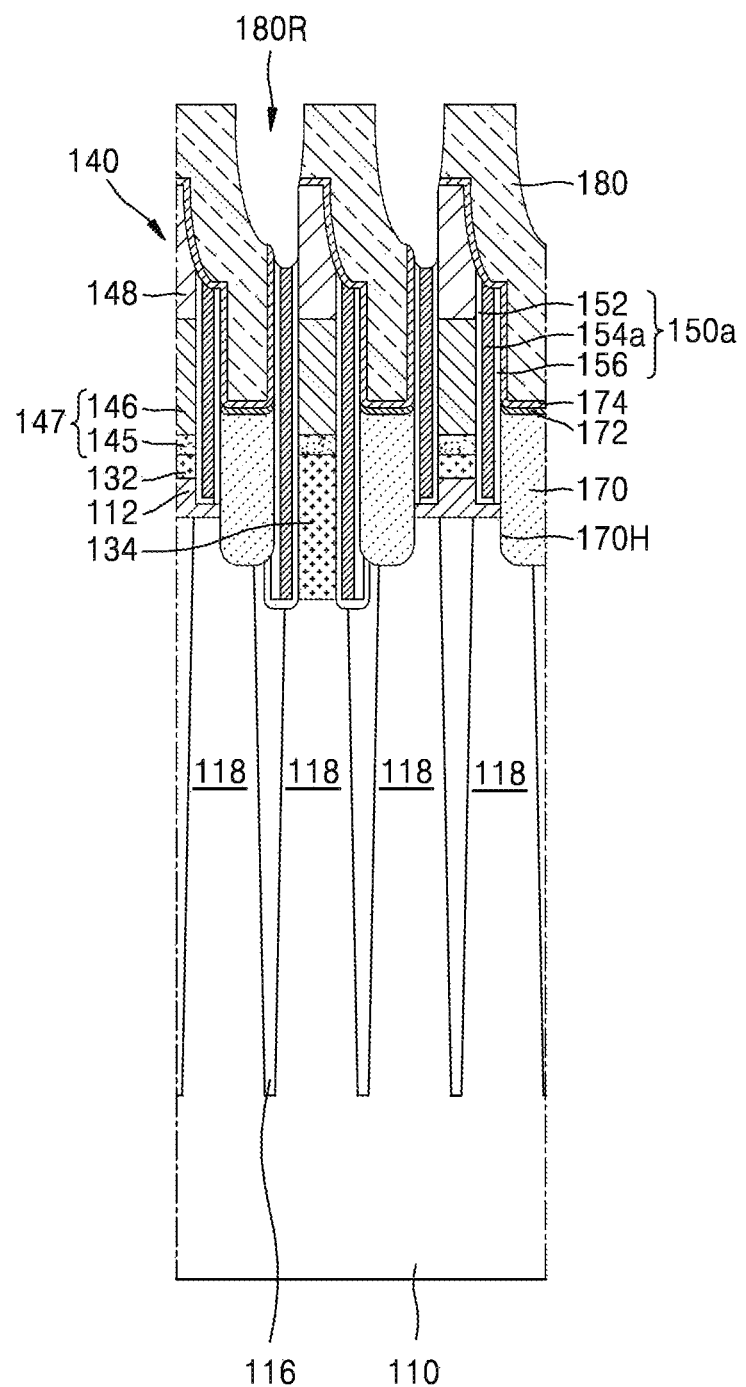

Referring to FIG. 4, a plurality of preliminary insulating spacer structures 150a may cover sidewalls of the bit line structures 140. For example, one of the bit line structures 140 may be disposed between two adjacent preliminary insulating spacer structures of the preliminary insulating spacer structures 150a. Two sidewalls of the one of the bit line structures 140 may be covered by the two adjacent preliminary insulating spacer structures. Each of the preliminary insulating spacer structures 150a may include a first insulating spacer 152, a sacrificial spacer 154a, and a second insulating spacer 156. In some embodiments, each of the first insulating spacer 152 and the second insulating spacer 156 may include an oxide layer, a nitride layer, or a combination thereof. The sacrificial spacer 154a between the first insulating spacer 152 and the second insulating spacer 156 may include a material having etch selectivity with respect to the first insulating spacer 152 and the second insulating spacer 156. For example, when the first insulating spacer 152 and the second insulating spacer 156 each include a nitride layer, the sacrificial spacer 154a may include an oxide layer.

A plurality of buried contact holes 170H each may be formed between two neighboring bit lines of the bit lines 147 An internal space of each of the plurality of buried contact holes 170H may be defined by the preliminary insulating spacer structure 150a covering, between two neighboring bit lines of the bit lines 147, a side wall of each of the two neighboring bit lines and one of the active regions 118 disposed under a region between the two neighboring bit lines.

A plurality of buried contacts 170 connected to the active regions 118 and a plurality of landing pads 180 may be formed in the plurality of buried contact holes 170H between the bit lines 147. The buried contacts 170 and the landing pads 180 may correspond to the buried contacts BC and the landing pads LP illustrated in FIG. 1. One of the buried contacts 170 and one of the landing pads 180 located above the one of the buried contacts 170 may be referred to as a contact structure.

The buried contacts 170 may extend on the active regions 118 in the third direction (direction Z of FIG. 1) perpendicular to the main surface of the substrate 110. Each of the landing pads 180 may be disposed above one of the buried contacts 170, extending onto one of the bit lines 147. The landing pads 180 may be connected to the active regions 118 via the buried contacts 170. The contact structure including the one of the landing pads 180 and the one of the buried contacts 170 may extend onto one of the bit line structures 140 from a space between two neighboring bit line structures of the bit line structures 140, and may face each side wall of the two neighboring bit line structures with one of the preliminary insulating spacer structures 150a including the sacrificial spacer 154a therebetween.

Each of the buried contacts 170 constituting the contact structure may be disposed between two neighboring bit line structures of the bit line structures 140. Each of the landing pads 180 may extend onto one of the bit line structures 140 from a space between the two neighboring bit line structures of the bit line structures 140 with one of the buried contacts 170 therebetween.

The landing pads 180 may be electrically connected to the buried contacts 170 and may extend from the inside of the buried contact holes 170H to locations on the bit line structures 140 to vertically overlap the bit line structures 140.

The landing pads 180 may be spaced apart from each other with a recess portion 180R therebetween. An upper end of each of the preliminary insulating spacer structures 150a may be exposed in the recess portion 180R.

The landing pads 180 may extend in the third direction (direction Z of FIG. 1) perpendicular to the main surface of the substrate 110 in regions between the bit lines 147, and may at least partially cover upper portions of the bit line structures 140 to vertically overlap at least portions of the bit lines 147.

In some embodiments, a metal silicide layer 172 may be formed between the buried contacts 170 and the landing pads 180. The metal silicide layer 172 may include cobalt silicide ($CoSi_x$), nickel silicide ($NiSi_x$), or manganese silicide ($MnSi_x$), but the present inventive concept is not limited thereto.

A conductive barrier layer 174 may be disposed between the landing pads 180 and the preliminary insulating spacer structures 150a and between the landing pads 180 and the bit line structures 140. The conductive barrier layer 174 may include metal, conductive metal nitride, or a combination thereof. For example, the conductive barrier layer 174 may have a Ti/TiN stack structure.

Figure 5:
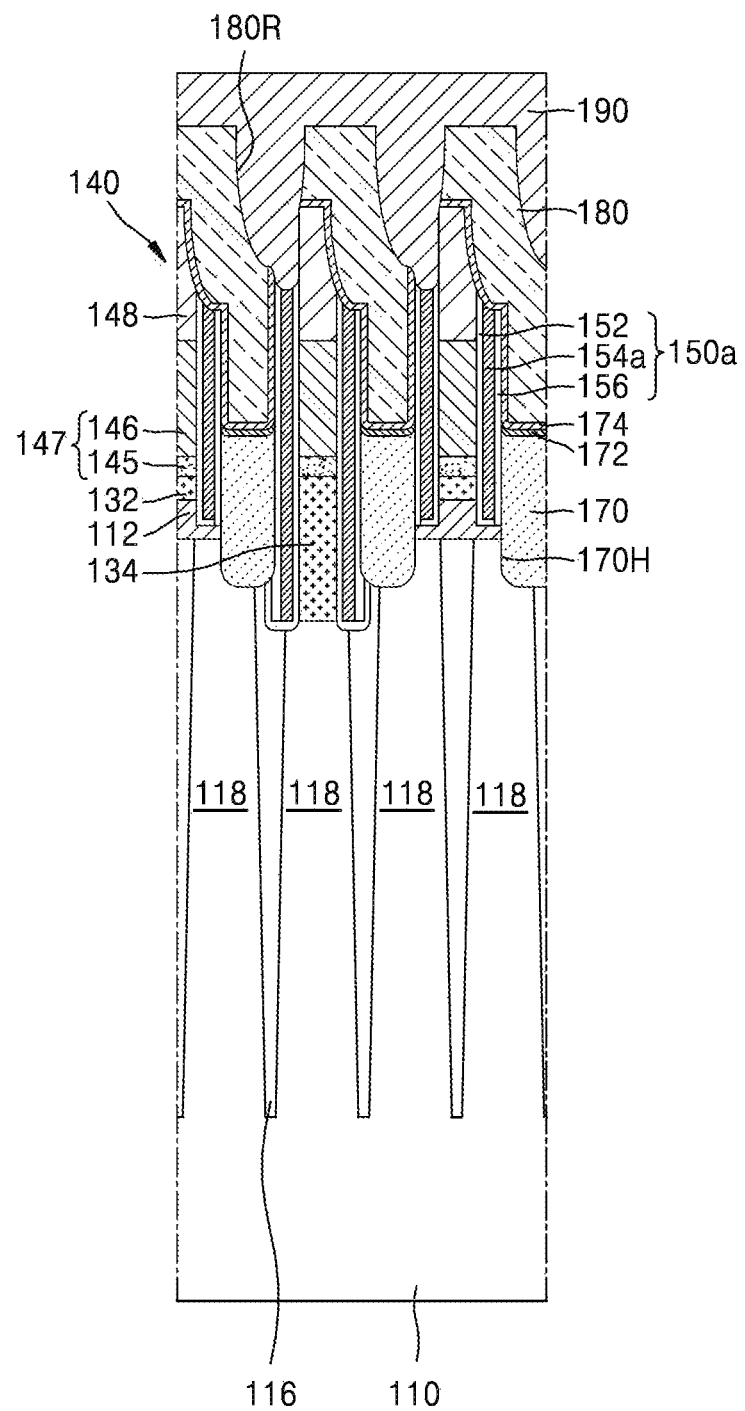

Referring to FIG. 5, the recess portion 180R may be filled, and a buried insulating layer 190 covering the landing pads 180 may be formed.

The buried insulating layer 190 may be in contact with the sacrificial spacer 154a exposed through the recess portion 180R. The buried insulating layer 190 may include a material having similar etching characteristics to the sacrificial spacer 154a. The buried insulating layer 190 may include, for example, an oxide layer.

The buried insulating layer 190 may be formed by a method by which no voids may occur in the recess portion 180R. In some embodiments, the buried insulating layer 190 may be formed by an atomic layer deposition (ALD) method.

Figure 6:
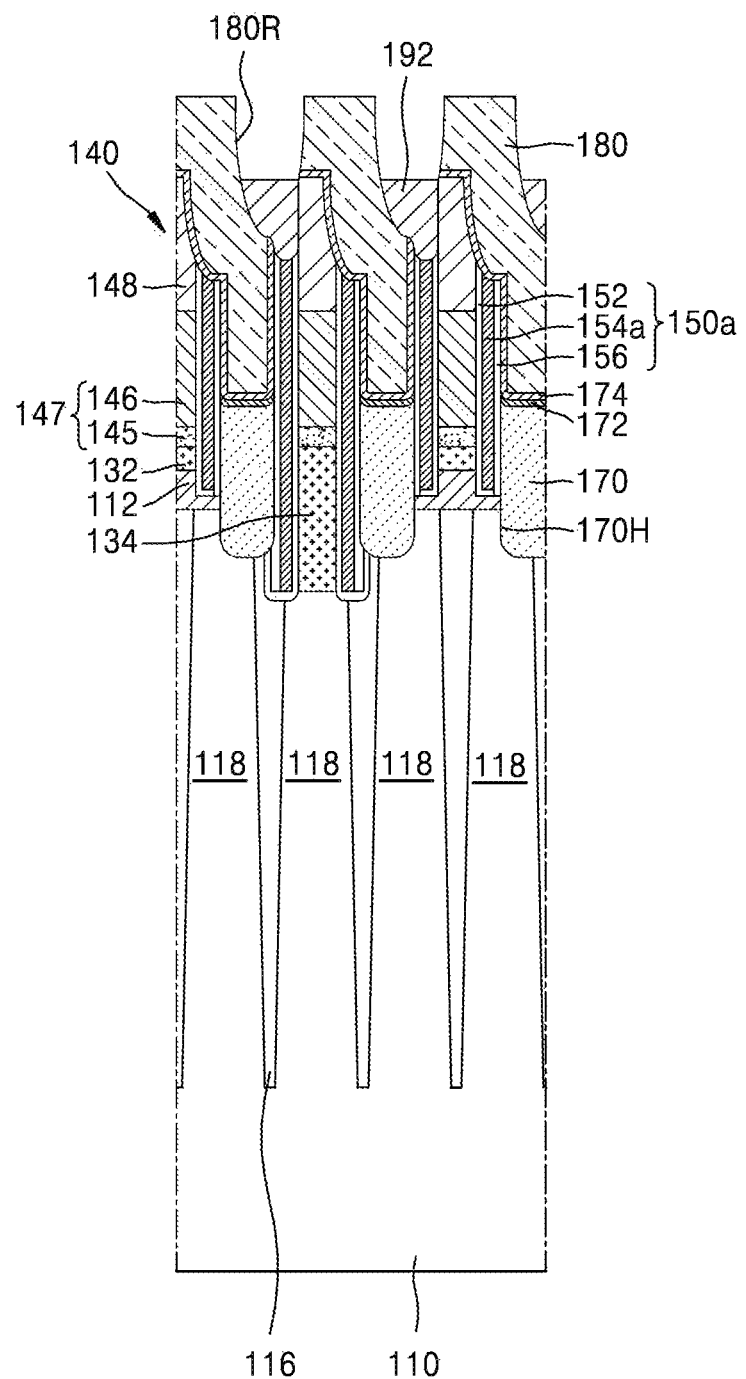

Referring to FIG. 6, a buried insulating pattern 192 is formed by removing an upper partial portion of the buried insulating layer (190 of FIG. 5). The buried insulating pattern 192 may be formed by removing a portion of the buried insulating layer 190 covering upper surfaces of the landing pads 180 and a portion of the buried insulating layer 190 filling an upper portion of the recess portion 180R. The buried insulating pattern 192 may fill a lower portion of the recess portion 180R. A level of an upper surface of the buried insulating pattern 192 may be lower than that of the upper surfaces of the landing pads 180. The buried insulating pattern 192 may be formed by removing a portion of the buried insulating layer 190 until the preliminary insulating spacer structures 150a are not exposed. For example, the buried insulating pattern 192 may cover the preliminary insulating spacer structures 150a.

In some embodiments, the buried insulating pattern 192 need not cover upper partial portions of the insulating capping lines 148, but the present inventive concept is not limited thereto. In some embodiments, the buried insulating pattern 192 may cover the insulating capping lines 148 without exposing the insulating capping lines 148.

In some embodiments, the buried insulating pattern 192 may be formed by removing an upper partial portion of the buried insulating layer 190 by an etch-back process. In some embodiments, the buried insulating pattern 192 may be formed by removing an upper partial portion of the buried insulating layer 190 by a wet etching method.

For example, a horizontal width of the recess portion 180R that is not filled by the buried insulating pattern 192 may be about 10 nm to about 40 nm.

Referring to FIG. 7, a cover insulating layer 200 is formed on the landing pads 180 and the buried insulating pattern 192. The cover insulating layer 200 may fill a portion of the recess portion 180R without completely filling the recess portion 180R, and may be conformally formed on the landing pads 180 and the buried insulating pattern 192 to define a recess space 200R on an upper surface of the cover insulating layer 200. A lower partial portion of the recess space 200R may be located in the recess portion 180R.

The cover insulating layer 200 may completely cover the upper surface of the buried insulating pattern 192. In this case, the buried insulating pattern 192 need not be exposed.

In some embodiments, the cover insulating layer 200 may include a material having similar etching characteristics to the first insulating spacer 152 and the second insulating spacer 156. The cover insulating layer 200 may include, for example, a nitride layer. The cover insulating layer 200 may be formed by a method of forming a thin film having relatively good step coverage. In some embodiments, the cover insulating layer 200 may be a nitride layer formed by a low pressure chemical vapor deposition (LPCVD) process or a low pressure ALD (LPALD) process.

Referring to FIG. 8, a cover insulating pattern 210 may be formed by removing an upper partial portion of the cover insulating layer (200 of FIG. 7). The cover insulating pattern 210 may cover a portion of a side surface of an upper portion of the recess portion 180R that is not filled by the buried insulating pattern 192. The cover insulating pattern 210 may cover a side surface of a lower portion of the recess portion 180R that is not filled by the buried insulating pattern 192. For example, the cover insulating pattern 210 may cover partially the side surface of the lower portion so that a top end of the cover insulating pattern 210 has a lower level than the upper surface of the landing pad 180. For example, the top end of the cover insulating pattern 210 may have a level that is tens of Å to hundreds of Å lower than that of the upper surface of the landing pad 180.

The cover insulating pattern 210 may partially cover the upper surface of the buried insulating pattern 192, and may define a gap portion 210G that exposes the rest of the upper surface of the buried insulating pattern 192. A horizontal cross-sectional shape of the cover insulating pattern 210 may have the gap portion 210G at the center and may extend along side surfaces of the recess portion 180R, for example, sidewalls of two landing pads of the landing pads 180 defining the lower portion of the recess portion 180R. For example, in a portion of the cover insulating pattern 210 spaced apart from a side wall of each of two adjacent landing pads of the landing pads 180, the gap portion 210G may penetrate from an upper surface of the cover insulating pattern 210 to a lower surface thereof.

The width of the cover insulating pattern 210 may increase in a direction from the upper surface of the cover insulating pattern 210 to the lower surface thereof. A width of the gap portion 210G, which is a space defined by the cover insulating pattern 210, may decrease in the direction from the upper surface of the cover insulating pattern 210 to the lower surface thereof. For example, the gap portion 210G may have a width that decreases in a direction from an upper end portion of the cover insulating pattern 210 to the substrate 110, that is, in a direction from an upper side of the gap portion 210G to a lower side thereof. Although it will be described below in detail with reference to FIG. 9A, the cover insulating pattern 210 may be formed such that a width of a bottom end of the gap portion 210G may be less than a width of a top end of the sacrificial spacer 154a, that is, a distance between respective top ends of the first insulating spacer 152 and the second insulating spacer 156.

The cover insulating pattern 210 and the preliminary insulating spacer structures 150a may be spaced apart from each other with the buried insulating pattern 192 therebetween. For example, since the buried insulating pattern 192 covers the preliminary insulating spacer structures 150a, the cover insulating pattern 210 need not be in contact with the preliminary insulating spacer structures 150a and may be vertically spaced apart above top ends of the preliminary insulating spacer structures 150a in the third direction (direction Z of FIG. 1).

In some embodiments, the cover insulating pattern 210 may be formed by removing an upper partial portion of the cover insulating layer 200 with an etch-back process.

Referring to FIGS. 9A and 9B, a separation space 192R and an air spacer 154 are formed by removing the buried insulating pattern (192 of FIG. 8) and the sacrificial spacer (154a of FIG. 8).

A space from which the buried insulating pattern 192 has been removed may be referred to as the separation space 192R. A space from which the sacrificial spacer 154a has been removed may be referred to as the air spacer 154. The air spacer 154 may be defined between the first insulating spacer 152 and the second insulating spacer 156. The first insulating spacer 152, the air spacer 154, and the second insulating spacer 156 may constitute an insulating spacer structure 150. The air spacer 154 refers to a space defined between the first insulating spacer 152 and the second insulating spacer 156. For example, the insulating spacer structure 150 may include the first insulating spacer 152, the air spacer 154, and the second insulating spacer 156 facing the first insulating spacer 152 with the air spacer 154 therebetween.

The buried insulating pattern 192 and the sacrificial spacer 154a may be removed by an etchant provided via the gap portion 210G. Accordingly, the separation space 192R formed by removing the buried insulating pattern 192 and the air spacer 154 may be connected to each other. A portion at which the separation space 192R and the air spacer 154 meet each other, for example, at a top end portion of the air spacer 154. The top end portion of the air spacer 154 may be referred to as an air entrance AGG. The air entrance AGG may refer to a space between respective top ends of the first insulating spacer 152 and the second insulating spacer 156.

A level of the top end portion of the air spacer 154, that is, the air entrance AGG, may be higher than a level of an upper surface of one of the bit lines 147. In some embodiments, a level of a bottom end portion of the air spacer 154 may be lower than a level of a lower surface of the one of the bit lines 147. Accordingly, the air spacer 154 may be disposed over the entire area of two sidewalls of the one of the bit lines 147.

A width of the separation space 192R may be greater than a width of the air spacer 154. The width of the air spacer 154 may be substantially constant in the third direction (direction Z of FIG. 1) perpendicular to the main surface of the substrate 110. The width of the separation space 192R may gradually increase in the third direction (direction Z of FIG. 1) away from the air entrance AGG.

Accordingly, a maximum width of the separation space 192R may be greater than a maximum width of the air spacer 154.

The air spacer 154 may include a first air spacer 154-1 and a second air spacer 154-2. One of the bit lines 147 may be interposed between the first air spacer 154-1 and the second air spacer 154-2 that are formed respectively at two sidewalls of the one bit line 147. The first air spacer 154-1 and the second air spacer 154-2 may be asymmetric in shape. The second air spacer 154-2 may be connected directly to the separation space 192R, whereas the first air spacer 154-1 need not be connected directly to the separation space 192R. The first air spacer 154-1 may be connected to the separation space 192R through the second air spacer 154-2. For example, the separation space 192R may be formed over only one of two sidewalls of one of the bit line structures 140.

A portion of a sidewall of one of the landing pads 180 may be exposed in the separation space 192R. For example, the portion of the side wall of the one of the landing pads 180 may be in contact with the separation space 192R.

The contact structure including one of the landing pads 180 located above one of the buried contacts 170 may extend onto one of bit line structures 140 from a space between two adjacent bit line structures of the bit line structures 140, and may face each side wall of the two adjacent bit line structures with the insulating spacer structure 150 including the air spacer 154 therebetween.

The buried contacts 170 constituting the contact structure may be disposed between two adjacent bit line structures of the bit line structures 140. Each of the landing pads 180 may extend onto one of the bit line structures 140 from a space between the two adjacent bit line structures of the bit line structures 140 with the buried contacts 170 therebetween.

As described above with reference to FIG. 8, since the cover insulating pattern 210 and the preliminary insulating spacer structure (150a of FIG. 8) are spaced apart from each other with the buried insulating pattern 192 therebetween, the air spacer 154, formed by removing the sacrificial spacer 154a of the preliminary insulating spacer structure 150a, may also be spaced apart from the cover insulating pattern 210. For example, the air spacer 154 and the cover insulating pattern 210 may be spaced apart from each other with the separation space 192R therebetween. Accordingly, the air entrance AGG and the gap portion 210G may also be spaced apart from each other. In detail, the separation space 192R may exist between the gap portion 210G and the air entrance AGG, and the gap portion 210G may be vertically spaced apart above the air entrance AGG in the third direction (direction Z of FIG. 1).

In some embodiments, the air entrance AGG and the gap portion 210G may be non-overlapped with respect to the third direction (direction Z of FIG. 1). For example, when viewed from the third direction (direction Z of FIG. 1), the air entrance AGG and the gap portion 210G may be spaced apart from each other.

The air entrance AGG may have a first width W1, and the bottom end of the gap portion 210G may have a second width W2 less than the first width W1. For example, the first width W1 may be equal to or greater than 4 nm, and the second width W2 may be equal to or less than 3 nm. When a width of the air spacer 154 is substantially constant in the third direction (direction Z of FIG. 1) perpendicular to the main surface of the substrate 110, the second width W2 may be less than the width of the air spacer 154.

In some embodiments, the separation space 192R and the air spacer 154 may be formed by removing the buried insulating pattern 192 and the sacrificial spacer 154a by a pulsed dry cleaning (PDC) method. In some embodiments, the separation space 192R and the air spacer 154 may be formed by removing the buried insulating pattern 192 and the sacrificial spacer 154a by a wet etching method.

In the pulse dry cleaning process, an HF gas may be applied to the cover insulating pattern 210 and the buried insulating pattern 192 so that the HF gas is adsorbed on the buried insulating pattern 192. Then, a heat treatment may be performed to cause the HF gas adsorbed on the buried insulating pattern 192 to remove selectively the buried insulating pattern 192. The applying of the HF gas and the performing the heat treatment may be until the buried insulating pattern 192 are removed completely to form the separation space 192R. After the formation of the separation space 192R, the pulsed dry cleaning process may be further performed to remove the sacrificial spacer 154a. In this case, an HF gas may be applied to the cover insulating pattern 210 and the sacrificial spacer 154a through the separation space 192R and the gap portion 210G so that the HF gas is adsorbed on the sacrificial spacer 154a, and then a heat treatment may be performed to cause the HF gas adsorbed on the sacrificial spacer 154a to remove selectively the sacrificial spacer 154a. The applying of the HF gas and the performing the heat treatment may be until the sacrificial spacer 154a is removed completely to form the air spacer 154. In this manner, the HF gas adsorbed on the buried insulating pattern 192 or on the sacrificial spacer 154a may have very high etch selectivity with respect to the cover insulating pattern 210 and the first insulating spacer 152 and the second insulating spacer 156. Accordingly, the loss of the air spacer 154 may be prevented in the formation of the air spacer 154.

Referring to FIG. 10, an air capping layer 250 covering the cover insulating pattern 210 and the landing pads 180 is formed. The air capping layer 250 may fill the gap portion 210G defined by the cover insulating pattern 210, covering the upper surfaces of the landing pads 180.

The air capping layer 250 may include a material having similar etching characteristics from the cover insulating pattern 210. The air capping layer 250 may include, for example, a nitride layer. The air capping layer 250 may be formed by a method of forming a thin film having relatively excellent gap-filling characteristics. In some embodiments, the air capping layer 250 may be a nitride layer formed by a plasma-enhanced chemical vapor deposition (PECVD) process. The nitride layer formed by PECVD process may have a film density lower than the nitride layer formed by LPCVD process. In an exemplary embodiment, the air capping layer 250 may be formed of nitride formed by PECVD process and the cover insulating pattern 210 may be formed of nitride formed by LPCVD process.

Since the gap portion 210G may have a width that decreases in a direction from an upper side of the gap portion 210G to a lower side thereof, the air capping layer 250 need not have a void therein. Also, even when the air capping layer 250 has a seam inside, the seam need not extend to the bottom end of the gap portion 210G. Accordingly, the separation space 192R and the air spacer 154 may be closed spaces that are completely blocked from the outside due to the cover insulating pattern 210 and the air capping layer 250.

The air capping layer 250 may include a tail portion 250t extending into the separation space 192R. The tail portion 250t refers to a portion of the air capping layer 250 which extends downwards with respect to a lower surface of the cover insulating pattern 210 from a portion of the air capping layer 250 filling the gap portion 210G. The tail portion 250t may be spaced apart from the air entrance AGG. In some embodiments, the tail portion 250t need not extend to a bottom surface of the separation space 192R. Since the width of the gap portion 210G defined by the cover insulating pattern 210 decreases in a direction from an upper side of the gap portion 210G to a lower side thereof, an extension length of the tail portion 250t into the separation space 192R may have a relatively small value. For example, the tail portion 250t need not be in contact with the landing pads 180, the first insulating spacer 152, and the second insulating spacer 156 that are exposed in the separation space 192R.

In an exemplary embodiment, the gap portion 210G may have a downwardly-decreasing width so that the gap portion 310 has a minimum width that causes to prevent the air capping layer 250, in the forming of the air capping layer, from being in contact with the contact structure in the separation space 192R.

Referring to FIGS. 11A and 11B together, an air capping pattern 252 is formed by removing an upper partial portion of the air capping layer (250 of FIG. 10). The air capping pattern 252 may cover the cover insulating pattern 210 and may fill the gap portion 210G. The separation space 192R may be defined by one of the bit line structures 140, one of the landing pads 180, the cover insulating pattern 210, and the air capping pattern 252. The separation space 192R may be connected to the air spacer 154.

Accordingly, the cover insulating pattern 210 may be located above the insulating spacer structure 150 with the separation space 192R therebetween.

The air capping pattern 252 may include the tail portion 250t extending into the separation space 192R. A top end of the air capping pattern 252 may have a higher level than the top end of the cover insulating pattern 210, and may have a lower level than the upper surfaces of the landing pads 180. For example, the top end of the air capping pattern 252 may have a level that is about 50 □ to about 200 □ lower than that of the upper surfaces of the landing pads 180.

Next, a plurality of capacitor lower electrodes (not shown), a capacitor dielectric layer (not shown) covering the plurality of capacitor lower electrodes, and a capacitor upper electrode (not shown) covering the capacitor dielectric layer may be formed on the landing pads 180 to form a semiconductor device.

The plurality of capacitor lower electrodes may be in contact with upper surfaces of the landing pads 180. In some embodiments, each of the capacitor lower electrodes may have a cylinder shape in which a lower portion thereof is closed. In some embodiments, each of the plurality of capacitor lower electrodes may have a pillar shape which is filled inside so as to have a circular horizontal cross-section.

The plurality of capacitor lower electrodes may include, for example, silicon doped with impurities, metal such as tungsten or copper, or a conductive metal compound such as titanium nitride.

In some embodiments, a supporting pattern that is in contact with sidewalls of the plurality of capacitor lower electrodes may be further formed. The supporting pattern may include, for example, a silicon nitride layer, a silicon carbon nitride (SiCN) layer, an N-rich silicon nitride layer, or a Si-rich silicon nitride layer.

The capacitor dielectric layer may conformally cover the capacitor lower electrodes. The capacitor dielectric layer may include, for example, TaO, TaAalO, TaON, AlO, AlSiO, HfO, HfSiO, ZrO, ZrSiO, TiO, TiAlO, BST ((Ba,Sr)TiO), STO (SrTiO), BTO (BaTiO), PZT (Pb(Zr,Ti)O), (Pb,La)(Zr,Ti)O, Ba(Zr,Ti)O, Sr(Zr,Ti)O, or a combination thereof.

The capacitor upper electrode may face the capacitor lower electrode with the capacitor dielectric layer therebetween. The capacitor upper electrode may include, for example, doped silicon, Ru, RuO, Pt, PtO, Ir, IrO, SRO (SrRuO), BSRO ((Ba,Sr)RuO), CRO (CaRuO), BaRuO, La(Sr,Co)O, Ti, TiN, W, WN, Ta, TaN, TiAlN, TiSiN, TaAlN, TaSiN, or a combination thereof.

The air spacer 154 and the separation space 192R may be isolated from the outside by the cover insulating pattern 210 and the air capping pattern 252. The air spacer 154 may decrease a capacitance between the contact structure constituted by one of the buried contacts 170 and one of the landing pads 180 and one of the bit lines 147 that is adjacent thereto.

The air capping pattern 252 may also be spaced apart from the air spacer 154 by the cover insulating pattern 210 spaced apart from the air spacer 154 with the separation space 192R therebetween.

If there is no cover insulating pattern 210, the air capping pattern 252 may be in contact with the air entrance AGG, which may cause a portion of the air spacer 154 to be filled with the air capping pattern 252 during a process of forming the air capping pattern 252. In this case, a volume of the air spacer 154 may decrease compared to if the cover insulating pattern 210 is present according to an exemplary embodiment of the present inventive concept, and thus, a capacitance between the contact structure constituted by one of the buried contacts 170 and one of the landing pads 180 and one of the bit lines 147 that is adjacent thereto may increase.

However, in the semiconductor device 1 according to the inventive concept, the air capping pattern 252 may be spaced apart from the air entrance AGG by the cover insulating pattern 210 without decreasing a volume of the air spacer 154. A width of the tail portion 250t, which is a portion of the air capping pattern 252 extending into the separation space 192R via the gap portion 210G, may also be equal to or less than the second width W2 less than the first width W1, which is a width of the air entrance AGG.

In addition, the tail portion 250t may extend into the separation space 192R via the gap portion 210G with a decreasing width in a direction from the air entrance AGG toward the substrate 110. Accordingly, a volume of the air spacer 154 need not be reduced by the formation of the air capping pattern 252 by preventing the tail portion 250t from extending into the air spacer 154 through the air entrance AGG. Accordingly, a capacitance between a contact structure constituted by one of the buried contacts 170 and one of the landing pads 180 and one of the bit lines 147 that is adjacent thereto may be minimized.

In an exemplary embodiment, the tail portion 250t of the air capping pattern 252 may have a thickness smaller than a width of the air entrance AGG of the air spacer 154.

Figure 11C:
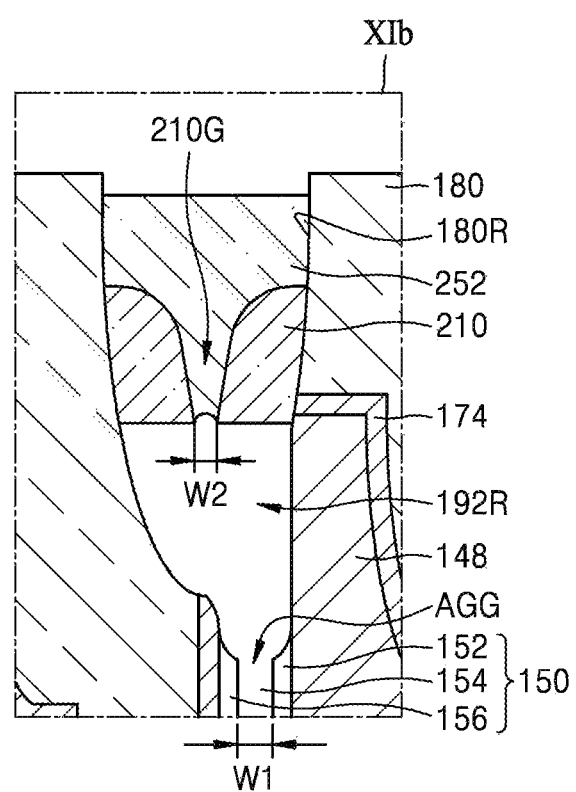
FIG. 11C includes a cross-sectional view and an enlarged view thereof showing a main portion of a semiconductor device according to an exemplary embodiment of the present inventive concept.

Referring to FIGS. 10 and 11C, the separation space 192R may protrude into the air capping pattern 252. In this case, the air capping pattern 252 need not have the tail portion 250t protruded into the separation space 192R. Instead, the air capping pattern 252 may have a concave surface covering the gap portion 210G of the cover insulating pattern 210. In the formation of the air capping layer 250, unlike FIG. 10, a deposition process of forming the air capping layer 250 may be controlled so that without formation of the tail portion 250t, the air capping layer 250 may cover the gap portion 210G. In this case, portions of the air capping layer 250 grown from sidewalls of the cover insulating pattern 210 may meet each other before the formation of the tail portion 250t in the initial phase of the formation of the air capping layer 250. The protruded portion of the separation space 192R may have a concave surface.

In an exemplary embodiment, a plug structure may include the cover insulating pattern 210 with the gap portion 210G, and the air capping pattern 252 covering the cover insulating pattern to seal the gap portion 210G. The gap portion 210G may have a downwardly-decreasing width. The air capping pattern 252 may have various shape as discussed with reference to FIGS. 13A and 13B, and FIGS. 14A and 14B, for example. The plug structure may have the tail portion discussed with reference to FIGS. 11B, 12B and 14B, for example or the plug structure may have a concave surface in place of the tail portion.

In an exemplary embodiment, an upper portion of one of the insulating capping lines 148 may a curved sidewall, and one of the landing pads 180 may cover the curved sidewall of the insulating capping line 148. The curved sidewall of the one of the insulating capping lines 148 may be in contact with the separation space 192R.

Figure 12A:
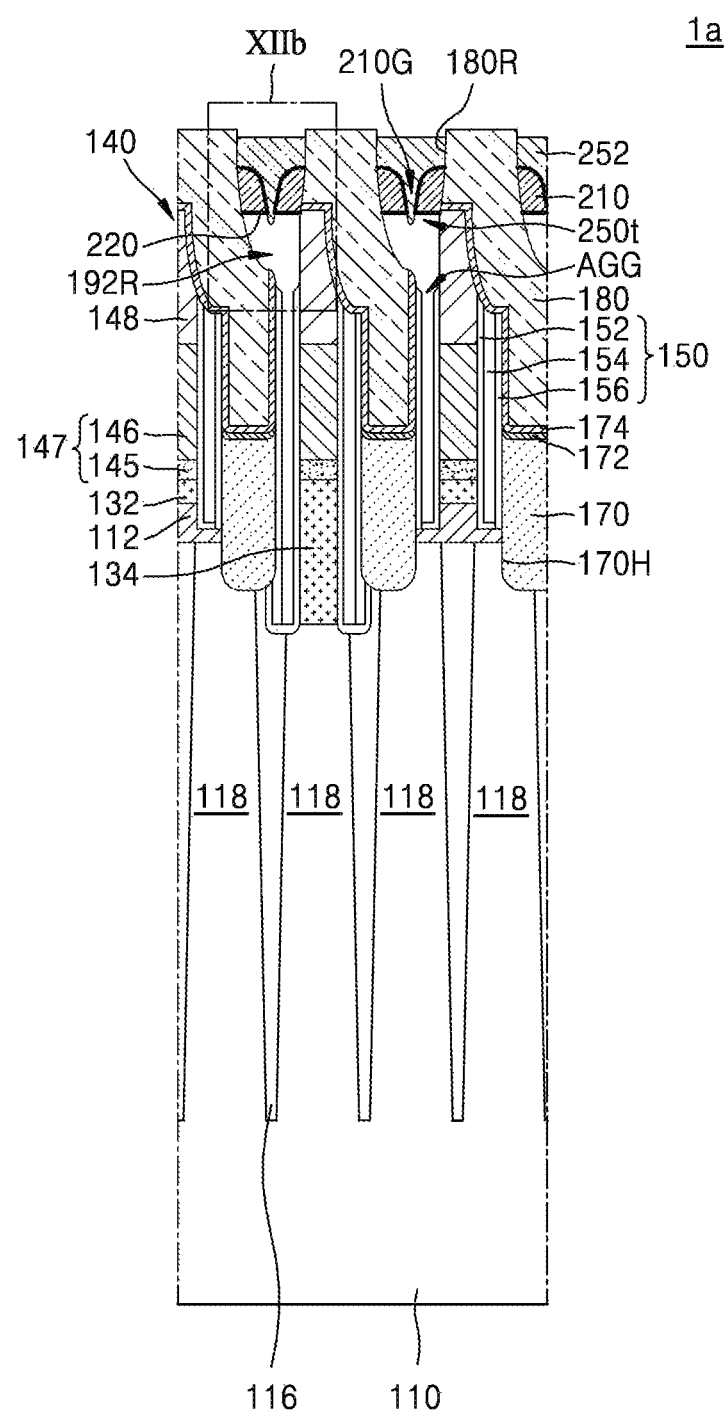
Figure 12B:
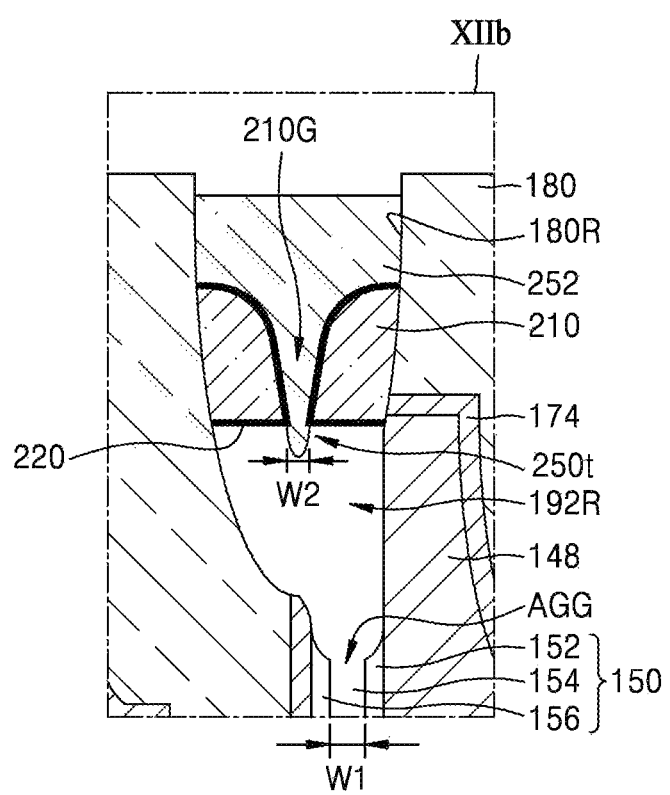

FIGS. 12A and 12B are respectively a cross-sectional view and an enlarged view thereof showing a main portion of a semiconductor device 1a according to an exemplary embodiment of the present inventive concept, in which FIG. 12B is an enlarged cross-sectional view of portion XIIb of FIG. 12A. Descriptions of FIGS. 12A and 12B overlapping those of FIGS. 2 to 11B will be omitted below, and the same reference numerals denote the same elements.

Referring to FIGS. 12A and 12B together, the semiconductor device 1a may include a slit oxide layer 220 located on the cover insulating pattern 210. The slit oxide layer 220 may be disposed between the cover insulating pattern 210 and the air capping pattern 252 and on a surface of the cover insulating pattern 210 exposed in the separation space 192R.

The slit oxide layer 220 may be formed on a surface of the cover insulating pattern 210 which is exposed during a cleansing process which is performed after the cover insulating pattern 210 is formed or after a process of removing the buried insulating pattern (192 of FIG. 8) and the sacrificial spacer (154a of FIG. 8) is performed. In an exemplary embodiment, the slit oxide layer 220 may be formed selectively on the surface of the cover insulating pattern 210 exposed by the gap portion 210G and the separation space 192R.

The slit oxide layer 220 may include, for example, an oxide layer or an oxynitride layer.

Figure 13A:
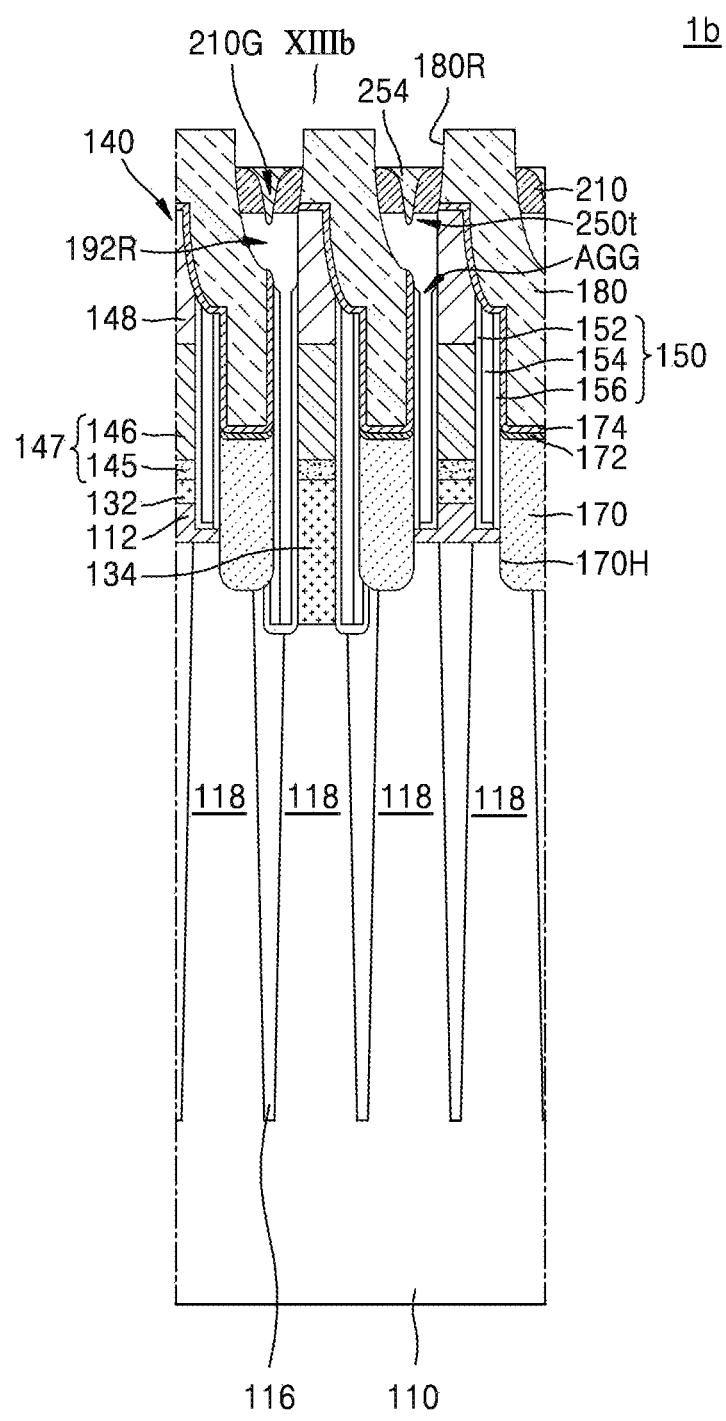
Figure 13B:
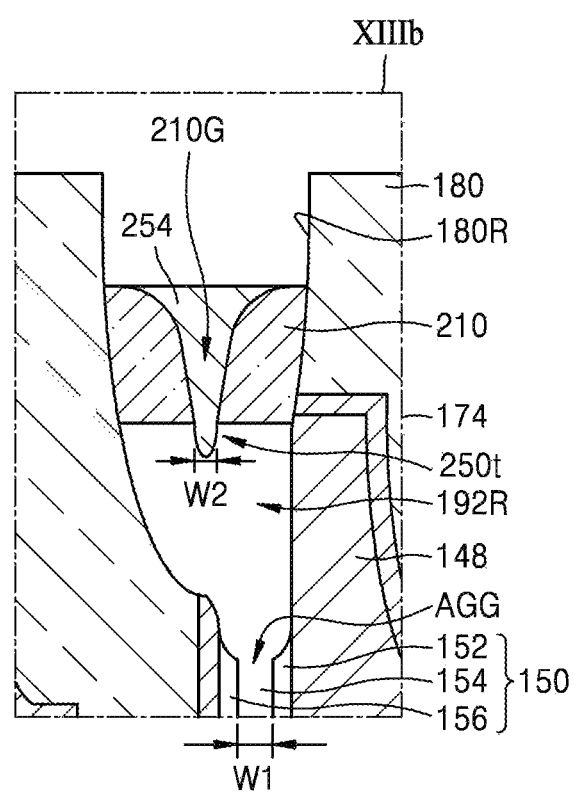

FIGS. 13A and 13B are respectively a cross-sectional view and an enlarged view thereof showing a main portion of a semiconductor device 1b according to an exemplary embodiment of the present inventive concept, in which FIG. 13B is an enlarged cross-sectional view of portion XIIIb of FIG. 13A. Descriptions of FIGS. 13A and 13B overlapping those of FIGS. 2 to 12B may be omitted below, and the same reference numerals denote the same elements.

Referring to FIGS. 13A and 13B together, the semiconductor device 1b includes the cover insulating pattern 210 and an air capping pattern 254. The air capping pattern 254 may be formed by performing a similar method from the air capping pattern 252 described above with reference to FIGS. 10A to 11B.

For example, as shown in FIGS. 10A and 10B, the air capping layer 250 covering the cover insulating pattern 210 and the landing pads 180 is formed. The air capping layer 250 may fill the gap portion 210G defined by the cover insulating pattern 210 and may cover the upper surfaces of the landing pads 180. Next, the air capping pattern 254 is formed by removing an upper partial portion of the air capping layer 250.

The air capping pattern 254 may be formed by removing a portion of the air capping layer 250 until the cover insulating pattern 210 is exposed.

The air capping layer 250 may include a material having similar etching characteristics with the cover insulating pattern 210, and an upper partial portion of the cover insulating pattern 210 may also be removed during a process of forming the air capping pattern 254 by removing a portion of the air capping layer 250.

An upper surface of the cover insulating pattern 210 and an upper surface of the air capping pattern 254 may be coplanar at the same height from the main surface of the substrate 110.

A top end of the cover insulating pattern 210 and a top end of the air capping pattern 254 may have the same level as each other, and may have a lower level than the upper surfaces of the landing pads 180. The top end of the cover insulating pattern 210 and the top end of the air capping pattern 254 may have a level that is about 50 Å to about 200 Å lower than the upper surfaces of the landing pads 180.

Figure 14A:
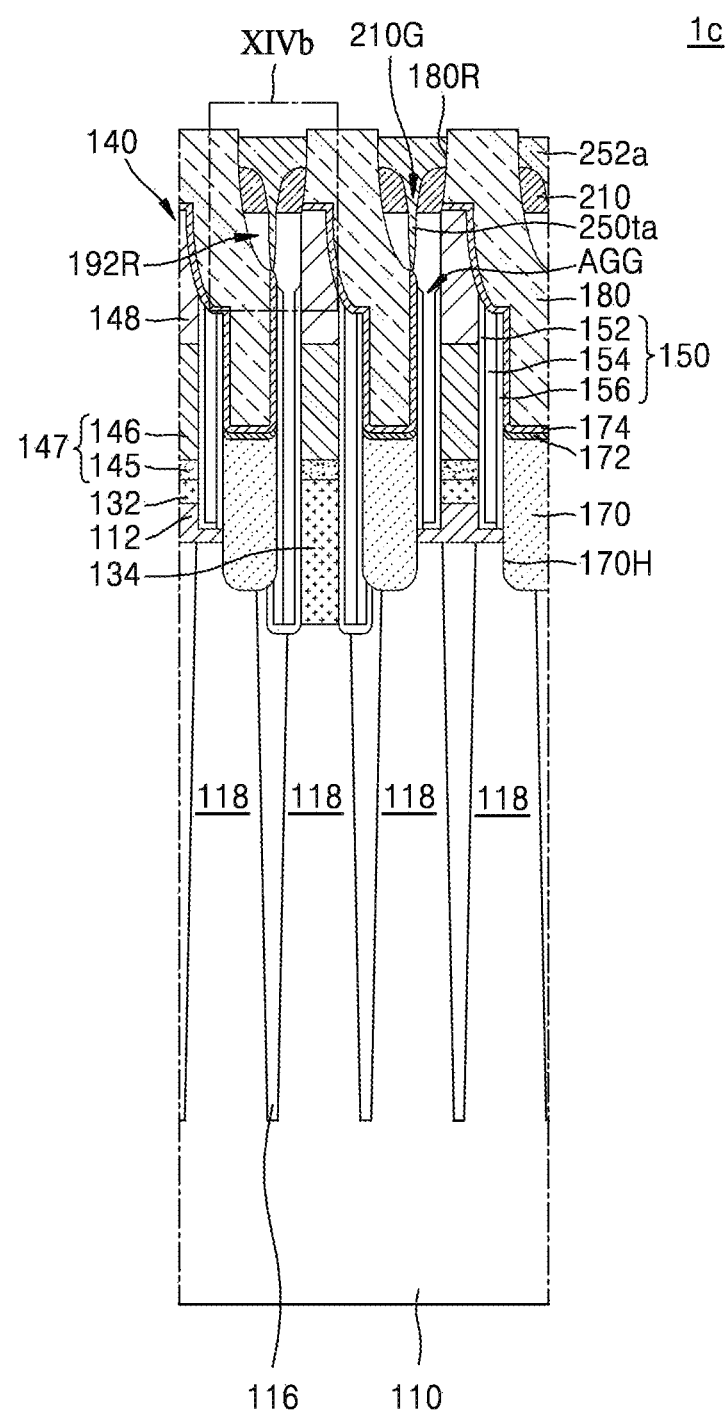
Figure 14B:
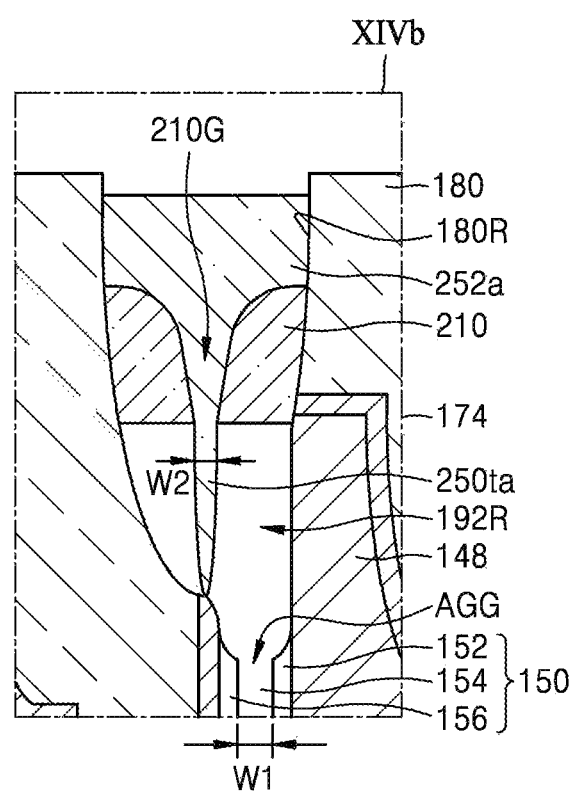

FIGS. 14A and 14B are respectively a cross-sectional view and an enlarged view thereof showing a main portion of a semiconductor device 1c according to an exemplary embodiment of the present inventive concept, in which FIG. 14B is an enlarged cross-sectional view of portion XIVb of FIG. 14A.

Referring to FIGS. 14A and 14B together, the semiconductor device 1c includes the cover insulating pattern 210 and an air capping pattern 252a. The air capping pattern 252a may be formed by performing a similar method from the air capping pattern 252 described above with reference to FIGS. 10A to 11B.

For example, similar to that shown in FIGS. 10A and 10B, an air capping layer covering the cover insulating pattern 210 and the landing pads 180 is formed. In this regard, the air capping layer may include a tail portion 250ta extending into the separation space 192R. The tail portion 250ta may extend to a bottom surface of the separation space 192R and may be spaced apart from the air entrance AGG.

The air capping layer may fill the gap portion 210G defined by the cover insulating pattern 210 and may cover the upper surfaces of the landing pads 180. Next, the air capping pattern 252a is formed by removing an upper partial portion of the air capping layer.

The air capping layer may include a material having similar etching characteristics with the cover insulating pattern 210. The air capping pattern 252a may cover the cover insulating pattern 210 and may fill the gap portion 210G.

In the semiconductor device 1c according to the inventive concept, the air capping pattern 252a may be spaced apart from the air entrance AGG by the cover insulating pattern 210, and thus, a volume of the air spacer 154 may be prevented from decreasing. In particular, since the second width W2, which is a width of the bottom end of the gap portion 210G that the cover insulating pattern 210 has, is less than the first width W1, which is a width of the air entrance AGG, a width of the tail portion 250ta, which is a portion of the air capping pattern 252a extending into the separation space 192R via the gap portion 210G, may also be equal to or less than the second width W2.

In addition, since the gap portion 210G extends while a width thereof decreases in a direction from a top end portion of the cover insulating pattern 210 to the substrate 110, the tail portion 250ta extending into the separation space 192R via the gap portion 210G may have a width of the tail portion 250ta that decreases in a direction toward the substrate 110.

Accordingly, a volume of the air spacer 154 need not be reduced by preventing the tail portion 250ta from extending into the air spacer 154 through the air entrance AGG. Accordingly, a capacitance between a contact structure constituted by one of the buried contacts 170 and one of the landing pads 180 and one of the bit lines 147 that is adjacent thereto may be minimized.

Although not separately illustrated, in some embodiments, an upper partial portion of the cover insulating pattern 210 may also be removed during a process of forming the air capping pattern 252a by removing a portion of the air capping layer, and thus, similar to those shown in FIGS. 13A and 13B, an upper surface of the cover insulating pattern 210 and an upper surface of the air capping pattern 252a be coplanar.

In addition, although not separately illustrated, in some embodiments, the semiconductor devices 1b and 1c shown in FIGS. 13A to 14B may further include the slit oxide layer 220 that the semiconductor device 1a shown in FIGS. 12A and 12B has.

Figure 15:
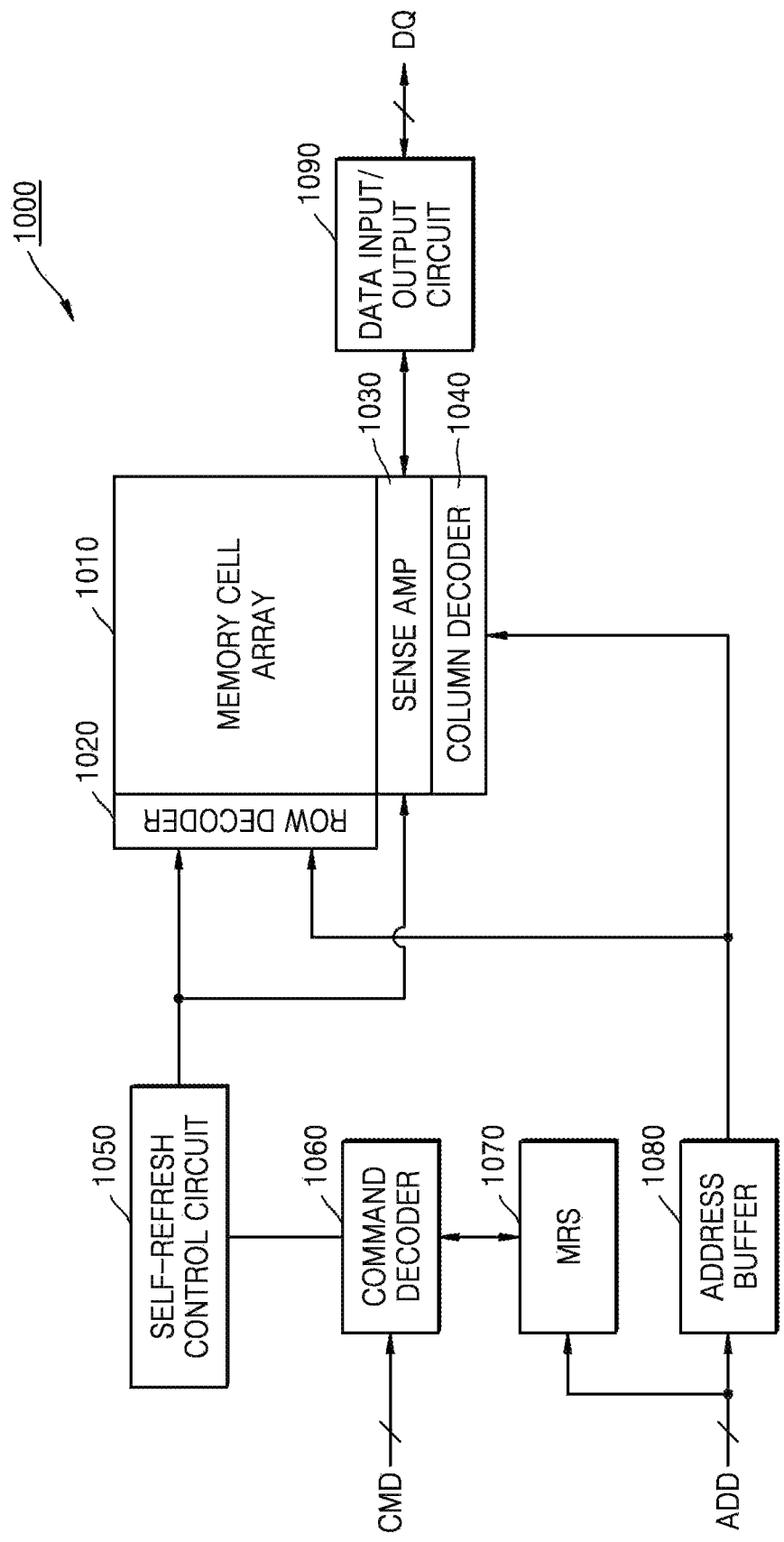
FIG. 15 is a block diagram of a semiconductor device according to an exemplary embodiment of the present inventive concept.

FIG. 15 is a block diagram of a semiconductor device 1000 according to an exemplary embodiment of the present inventive concept.

Referring to FIG. 15, the semiconductor device 1000 includes a memory cell array 1010, a row decoder 1020, a sense amplifier 1030, a column decoder 1040, a self-refresh control circuit 1050, a command decoder 1060, a mode register set/extended mode register set (MRS/EMRS) circuit 1070, an address buffer 1080, and a data input/output circuit 1090. The semiconductor device 1000 includes at least one of the semiconductor devices described above with reference to FIGS. 1 to 14B.

A plurality of memory cells for storing data are arranged in row and column directions in the memory cell array 1010. The plurality of memory cells may each include a cell capacitor and an access transistor. A gate of the access transistor may be connected to a corresponding word line from among a plurality of word lines arranged in the row direction. One of a source and a drain of the access transistor may be connected to a bit line BL or complementary bit line (/BL) arranged in the column direction, and the other may be connected to the cell capacitor.

The sense amplifier 1030 senses and amplifies data of the memory cell and stores the data in the memory cell. The sense amplifier 1030 may be realized as a cross-coupled amplifier connected between the bit line BL and the complementary bit line/BL.

Data DQ input via the data input/output circuit 1090 is written in the memory cell array 1010 based on an address signal ADD, and data DQ read from the memory cell array 1010 based on the address signal ADD is externally output via the data input/output circuit 1090. The address signal ADD is input in the address buffer 1080 to designate the memory cell to/from which data is to be written/read. The address buffer 1080 temporarily stores the address signal ADD input from the outside.

The row decoder 1020 decodes a row address among the address signal ADD output from the address buffer 1080, in order to designate a word line connected to the memory cell to/from which data is to be input/output. That is, the row decoder 1020 decodes the row address output from the address buffer 1080 and enables a corresponding word line in a data write or read mode. Also, the row decoder 1020 decodes the row address generated from an address counter and enables a corresponding word line in a self-refresh mode.

The column decoder 1040 decodes a column address among the address signal ADD output from the address buffer 1080, in order to designate a bit line connected to the memory cell to/from which data is to be input/output.

The memory cell array 1010 outputs data or writes data from/to the memory cell designated by the row and column addresses.

The command decoder 1060 receives a command signal CMD applied from the outside and decodes the signal to internally generate a decoded command signal, for example, a self-refresh entry command and a self-refresh exit command.

The MRS/EMRS circuit 1070 sets an internal mode register in response to an MRS/EMRS command and the address signal ADD for designating an operation mode of the semiconductor device 1000.

In addition, although not illustrated in FIG. 15, the semiconductor device 1000 may further include a clock circuit for generating a clock signal and a power circuit for receiving a power voltage applied from the outside to generate or distribute an inner voltage.

The self-refresh control circuit 1050 controls a self-refresh operation of the semiconductor device 1000 in response to the command output from the command decoder 1060.

The command decoder 1060 may include an address counter, a timer, and a core voltage generator. The address counter may generate a row address for designating a row address which is to be the subject of the self-refresh operation and apply the row address to the row decoder 1020, in response to the self-refresh entry command output from the command decoder 1060. The address counter may end the counting operation in response to the self-refresh exit command output from the command decoder 1060.

The memory cell array 1010 and the sense amplifier 1030 may constitute a memory core unit.

Figure 16:
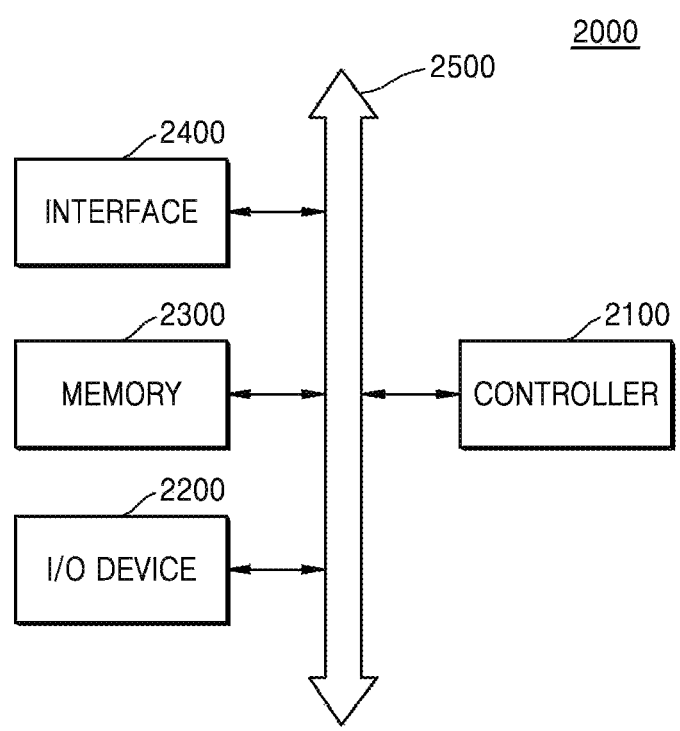
FIG. 16 is a structural diagram of a system including a semiconductor device, according to an exemplary embodiment of the present inventive concept.

FIG. 16 is a structural diagram of a system 2000 including a semiconductor device, according to an exemplary embodiment of the present inventive concept.

Referring to FIG. 16, the system 2000 includes a controller 2100, an input/output device 2200, a memory device 2300, and an interface 2400. The system 2000 may be a mobile system or a system for transmitting or receiving information. In some embodiments, the mobile system may be a personal digital assistant (PDA), a portable computer, a web tablet, a wireless phone, a digital music player, or a memory card. The controller 2100 is for controlling an execution program of the system 2000, and may be a microprocessor, a digital signal processor, a microcontroller, or a similar device. The input/output device 2200 may be used to input or output data of the system 2000. The system 2000 may be connected to an external device, such as a personal computer (PC) or a network, by using the input/output device 2200, and may exchange data with the external device. The input/output device 2200 may be, for example, a keypad, a keyboard, or a display.

The memory device 2300 may store a code and/or data for the operation of the controller 2100, or may store data processed by the controller 2100. The memory device 2300 may include at least one of the semiconductor devices according to embodiments of the inventive concept described above with reference to FIGS. 1 to 14B, or at least one of the semiconductor devices modified and changed therefrom within the scope of the inventive concept.

The interface 2400 may be a data transmission path between the system 2000 and other external devices. The controller 2100, the input/output device 2200, the memory device 2300, and the interface 2400 may communicate with one another via a bus 2500. The system 2000 may be used in a mobile phone, an MP3 player, a navigation device, a portable multimedia player (PMP), a solid state disk (SSD), or household appliances.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor device, comprising:
a first contact structure;
a second contact structure;
a first bit line structure disposed between the first contact structure and the second contact structure;
a first air spacer interposed between the first contact structure and the first bit line structure;
a first separation space connected to an air entrance of the first air spacer and interposed between the first contact structure and the first bit line structure, wherein the first separation space contains no solid material; and
a cover insulating pattern with a gap portion interposed between the first contact structure and the second contact structure, wherein the gap portion has a downwardly-decreasing width; and
an air capping pattern covering the cover insulating pattern to seal the first separation space.

2. The semiconductor device of claim 1,
wherein the air capping pattern includes a tail portion protruding into the first separation space.

3. The semiconductor device of claim 2,
wherein the tail portion of the air capping pattern has a thickness smaller than a width of the air entrance of the first air spacer.

4. The semiconductor device of claim 2,
wherein the gap portion has a minimum width less than a width of the air entrance of the first air spacer.

5. The semiconductor device of claim 1,
wherein the first separation space protrudes into the cover insulating pattern so that the air capping pattern has a concave surface covering the gap portion of the cover insulating pattern.

6. The semiconductor device of claim 1,
wherein the first separation space is in contact with a sidewall of the first contact structure and a sidewall of the first bit line structure.

7. The semiconductor device of claim 1,
wherein the cover insulating pattern is formed of a first nitride layer,
wherein the air capping pattern is formed of a second nitride layer.

8. The semiconductor device of claim 7,
wherein the first nitride layer includes silicon nitride (SiN),
wherein the second nitride layer includes silicon carbon nitride (SiCN).

9. The semiconductor device of claim 7,
wherein the first nitride layer includes SiN having a first film density, and
wherein the second nitride layer includes SiN having a second film density smaller than the first film density.

10. The semiconductor device of claim 1, further comprising:
an insulating spacer disposed between the first air spacer and a lower portion of the first contact structure and between the first air spacer and a lower portion of the first bit line structure.

11. The semiconductor device of claim 10,
wherein the cover insulating pattern is separated from the insulating spacer by the first separation space.

12. The semiconductor device of claim 10,
wherein the insulating spacer include an oxide layer or a nitride layer.

13. The semiconductor device of claim 1, further comprising:
a second air spacer interposed between the first bit line structure and the second contact structure,
wherein the second air spacer is connected to the first air spacer.

14. The semiconductor device of claim 13,
wherein the second air spacer is shorter than the first air spacer.

15. A semiconductor device, comprising:
a first contact structure;
a second contact structure;
a first bit line structure disposed between the first contact structure and the second contact structure;
a first air spacer interposed between the first contact structure and the first bit line structure;
a plug structure interposed between the first contact structure and the second contact structure; and
a first separation space disposed between the first air spacer and the plug structure and connected to the first air spacer,
wherein the first separation space has a width increasing in a direction from the first air spacer to the plug structure, and wherein the first separation space contains no solid material.

16. The semiconductor device of claim 15,
wherein the plug structure comprises:
a cover insulating pattern with a gap portion,
wherein the gap portion has a downwardly-decreasing width; and
an air capping pattern covering the cover insulating pattern to seal the gap portion.

17. The semiconductor device of claim 15,
wherein the first separation space is defined by a bottom surface of the plug structure, a sidewall of the first bit line structure, and a curved sidewall of the first contact structure.

18. The semiconductor device of claim 17,
wherein a distance of the curved sidewall of the first contact structure and the sidewall of the first bit line structure increases in a direction from the first air spacer to the plug structure.

19. A semiconductor device, comprising:
a first contact structure;
a second contact structure;
a first bit line structure,
wherein the first bit line structure is disposed between a lower portion of the first contact structure and a lower portion of the second contact structure, and
wherein an upper portion of the second contact structure is on an upper surface of the first bit line structure;
a first air spacer interposed between the lower portion of the first contact structure and a lower portion of the first bit line structure;
a first separation space connected to an air entrance of the first air spacer and interposed between an upper portion of the first contact structure and an upper portion of the first bit line structure, wherein the first separation space contains no solid material; and a plug structure interposed between the upper portion of the first contact structure and the upper portion of the second contact structure to seal the first separation space.

20. The semiconductor device of claim 19, wherein the plug structure includes a tail portion that protrudes into the first separation space.

* * * * *